United States Patent
Pope et al.

(10) Patent No.: US 11,726,928 B2
(45) Date of Patent: Aug. 15, 2023

(54) NETWORK INTERFACE DEVICE WITH BUS SEGMENT WIDTH MATCHING

(71) Applicant: XILINX, INC., San Jose, CA (US)

(72) Inventors: Steven Leslie Pope, Cambridge (GB); Derek Edward Roberts, Cambridge (GB); Dmitri Kitariev, Newport Beach, CA (US); Neil Duncan Turton, Cambridge (GB); David James Riddoch, Cambridgeshire (GB); Ripduman Sohan, Washington, DC (US)

(73) Assignee: XILINX, INC., San Jose, CA (US)

( * ) Notice: Subject to any disclaimer, the term of this patent is extended or adjusted under 35 U.S.C. 154(b) by 43 days.

(21) Appl. No.: 17/357,083

(22) Filed: Jun. 24, 2021

(65) Prior Publication Data
US 2022/0414028 A1    Dec. 29, 2022

(51) Int. Cl.
G06F 13/16    (2006.01)
G06F 13/28    (2006.01)
G11C 7/10    (2006.01)

(52) U.S. Cl.
CPC ...... *G06F 13/1621* (2013.01); *G06F 13/1642* (2013.01); *G06F 13/1678* (2013.01); *G06F 13/287* (2013.01); *G11C 7/1069* (2013.01); *G11C 7/1096* (2013.01)

(58) Field of Classification Search
CPC ............. G06F 13/1678; G06F 13/1642; G06F 13/1621; G06F 13/287; G06F 13/14; G06F 13/1684; G06F 13/1694
See application file for complete search history.

(56) References Cited

U.S. PATENT DOCUMENTS

| | | | |
|---|---|---|---|
| 6,243,781 B1* | 6/2001 | Gandhi | G06F 13/4036 710/313 |
| 6,434,674 B1* | 8/2002 | DeWilde | G06F 13/1673 711/149 |
| 10,957,384 B1* | 3/2021 | Hung | G11C 29/789 |
| 2005/0005082 A1* | 1/2005 | Au | G11C 7/1066 711/170 |
| 2008/0262760 A1* | 10/2008 | Sakurai | G06F 13/4045 702/58 |
| 2017/0187589 A1* | 6/2017 | Pope | H04L 1/0082 |
| 2017/0220499 A1 | 8/2017 | Gray | |
| 2019/0081899 A1* | 3/2019 | Mundkur | H04L 47/34 |
| 2020/0106668 A1* | 4/2020 | Pope | H04L 41/5051 |
| 2020/0117622 A1* | 4/2020 | Boehm | G06F 11/0751 |
| 2020/0242055 A1* | 7/2020 | Raj S V | G06F 13/1673 |
| 2020/0356514 A1 | 11/2020 | Orthner et al. | |

FOREIGN PATENT DOCUMENTS

EP    3503507 A1    6/2019

\* cited by examiner

*Primary Examiner* — Raymond N Phan
(74) *Attorney, Agent, or Firm* — Patterson + Sheridan, LLP

(57) ABSTRACT

A network interface device has a data source, a data sink and an interconnect configured to receive data from the data source and to output data to the data sink. The interconnect has a memory having memory cells. Each memory cell has a width which matches a bus segment width. The memory is configured to receive a first write output with a width corresponding to the bus segment width. The write output comprises first data to be written to a first memory cell of the memory, the first data being from the data source.

20 Claims, 14 Drawing Sheets

NETWORK INTERFACE DEVICE WITH BUS SEGMENT WIDTH MATCHING

TECHNICAL FIELD

This application relates to a network interface device.

BACKGROUND

Network interface devices (e.g., a network interface card (NIC) or SmartNIC) are known and are typically used to provide an interface between a computing device and a network. Some network interface devices can be configured to process data which is received from the network and/or process data which is to be put on the network.

For some network interface devices, there may be a drive to provide increased specializations of designs towards specific applications and/or the support of increasing data rates.

SUMMARY

A disclosed network interface device comprises: a data source; a data sink; and an interconnect configured to receive data from the data source and to output data to the data sink, the interconnect comprising: a memory having memory cells, each memory cell having a width which matches a bus segment width, the memory being configured to receive a first write output with a width corresponding to the width of the bus segment, the write output comprising first data to be written to a first memory cell of the memory, the first data being from the data source.

The network interface may comprise one or more segmented buses connecting the data source and the data sink to the interconnect, the segmented buses comprising bus segments having the bus segment width.

The memory may be configured to output the first data in response to a read request from the data sink, the output having the bus segment width.

The network interface may comprise a plurality of data sources and a plurality of data sinks.

The interconnect may comprise a memory multiplexer configured to receive a plurality of requests, the plurality of requests comprise a plurality of read requests from the plurality of the data sinks and a plurality of write requests from a plurality of the data sinks, the memory multiplexer being configured to determine which one or more of the requests is to proceed and which one or more requests are to be back pressured.

The memory multiplexor may be configured to determine that two requests are for the same memory cell of the memory and to determine which one of the two requests is to be proceed.

The memory multiplexor may be configured to determine that the request which is to proceed is the request which is part of a larger series of requests.

The interconnect may comprise a configurable interface, the configurable interface being configurable to provide one or more interfaces with the size of each individual interface having a size equal to an integer multiple of the bus segment width, the integer multiple being one or more.

Different ones of the individual interfaces of the configurable interface may be configured to receive data for different data sinks.

A total width of the configurable interface may be equal to a total width of all bus segments of a bus.

The interconnect may comprise an interface, the interface having a width equal to a width of all bus segments of a bus, the interface being configured to receive data from a plurality of different data sources at the same time.

The network interface device may comprise a write pipe configured to receive a first write request for the first data from the data source, to associate an address of the first memory cell with the first data of the first write request and to provide the first write output.

The write pipe may comprise a buffer for storing the first write output before the first write output is output by the write pipe.

The network interface device may comprise a read request pipe configured to receive a read request from the data sink and to associate an address of a memory cell of the memory from which data is to be read.

The data source may be configured to output capsules and the data sink may be configured to receive capsules, the capsules comprising data and routing information.

The capsules may further comprise virtual channel information.

The memory may comprise a plurality of memory banks, each memory bank having a plurality of memory cells.

Each memory cell comprises a random access memory having a port width which is the width of a bus segment.

According to another aspect, there is provided a method in a network interface device, the method comprising: receiving, from a data source of the network interface device, at a memory of the network interface device, a first write output with a width corresponding to a bus segment width, the write output comprising first data; and writing the first data to a first memory cell of the memory, the first memory cell having a width which matches the bus segment width.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF DRAWINGS

Some embodiments are illustrated by way of example only in the accompanying drawings. The drawings, however, should not be construed to be limiting of the arrangements to only the particular implementations shown. Various aspects and advantages will become apparent upon review of the following detailed description and upon reference to the drawings.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

When data is to be transferred between two data processing systems over a data channel, each of the data processing systems has a suitable network interface to allow it to communicate across the channel. The data channel may be provided by a network. For example, the network maybe based on Ethernet technology or any other suitable technology. The data processing systems may be provided with network interfaces that are capable of supporting the physical and logical requirements of the network protocol. The physical hardware component of network interfaces are referred to as network interface devices or network interface cards (NICs). In this document, the network interface device is referred to a NIC. It should be appreciated that the NIC may be provided in any suitable hardware form such as integrated circuit or hardware module. A NIC is not necessarily implemented in card form.

Computer systems may have an operating system (OS) through which user level applications communicate with the network. A portion of the operating system, known as the kernel, includes protocol stacks for translating commands and data between the applications and a device driver specific to the network interface device, and the device drivers for directly controlling the network interface device. By providing these functions in the operating system kernel, the complexities of and differences among network interface devices can be hidden from the user level applications. In addition, the network hardware and other system resources (such as memory) can be safely shared by many applications and the system can be secured against faulty or malicious applications.

Figure 1:
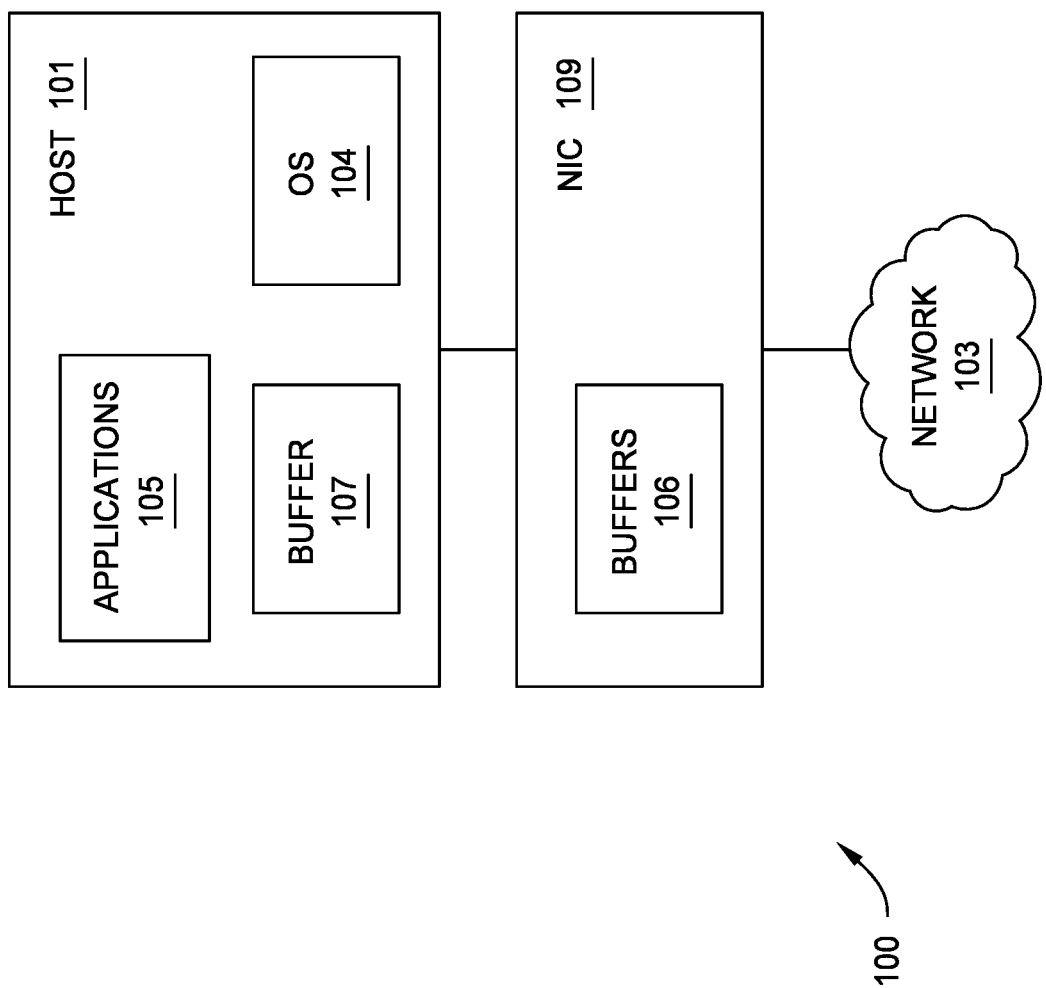
FIG. 1 shows a schematic view of a data processing system coupled to a network via a network interface device.

A typical data processing system 100 for carrying out transmission across a network is shown in FIG. 1. The data processing system 100 comprises a host computing device 101 coupled to a network interface device 109 that is arranged to interface the host to network 103. The host computing device 101 includes an operating system 104 supporting one or more user level applications 105. The host computing device 101 may also include a network protocol stack (not shown). The network protocol stack may be a Transmission Control Protocol (TCP) stack or any other suitable protocol stack. The protocol stack may be a transport protocol stack.

The application 105 may send and receive TCP/IP (Internet Protocol) messages by opening a socket and reading and writing data to and from the socket, and the operating system 104 causes the messages to be transported across the network.

Some systems may offload at least partially the protocol stack to the network interface device 109. For example, in the case that the stack is a TCP stack, the network interface device 109 may comprise a TCP Offload Engine (TOE) for performing the TCP protocol processing. By performing the protocol processing in the network interface device 109 instead of in the host computing device 101, the demand on the host system's 101 processor/s may be reduced. Data to be transmitted over the network, may be sent by an application 105 via a TOE-enabled virtual interface driver, by-passing the kernel TCP/IP stack entirely. Data sent along this fast path therefore need only be formatted to meet the requirements of the TOE driver.

The host computing device 101 may comprise one or more processors and one or more memories. In some embodiments, the host computing device 101 and the network interface device 109 may communicate via a bus, for example a peripheral component interconnect express (PCIe bus).

During operation of the data processing system, data to be transmitted onto the network may be transferred from the host computing device 101 to the network interface device 109 for transmission. In one example, data packets may be transferred from the host to the network interface device directly by the host processor. The host may provide data to one or more buffers 106 located on the network interface device 109. The network interface device 109 may then prepare the data packets and transmit them over the network 103.

Alternatively, the data may be written to a buffer 107 in the host system 101. Some systems may support both of these data transfer mechanisms. The data may then be retrieved from the buffer 107 by the network interface device and transmitted over the network 103.

In both of these cases, data may be temporarily stored in one or more buffers prior to transmission over the network.

The data processing system may also receive data from the network via the network interface device 109.

A data processing system could be any kind of computing device, such as a server, personal computer, or handheld device. Some embodiments may be suitable for use in networks that operate TCP/IP over Ethernet. In other embodiments one or more different protocols may be used. Embodiments may be used with any suitable networks, wired or wireless.

Figure 2:
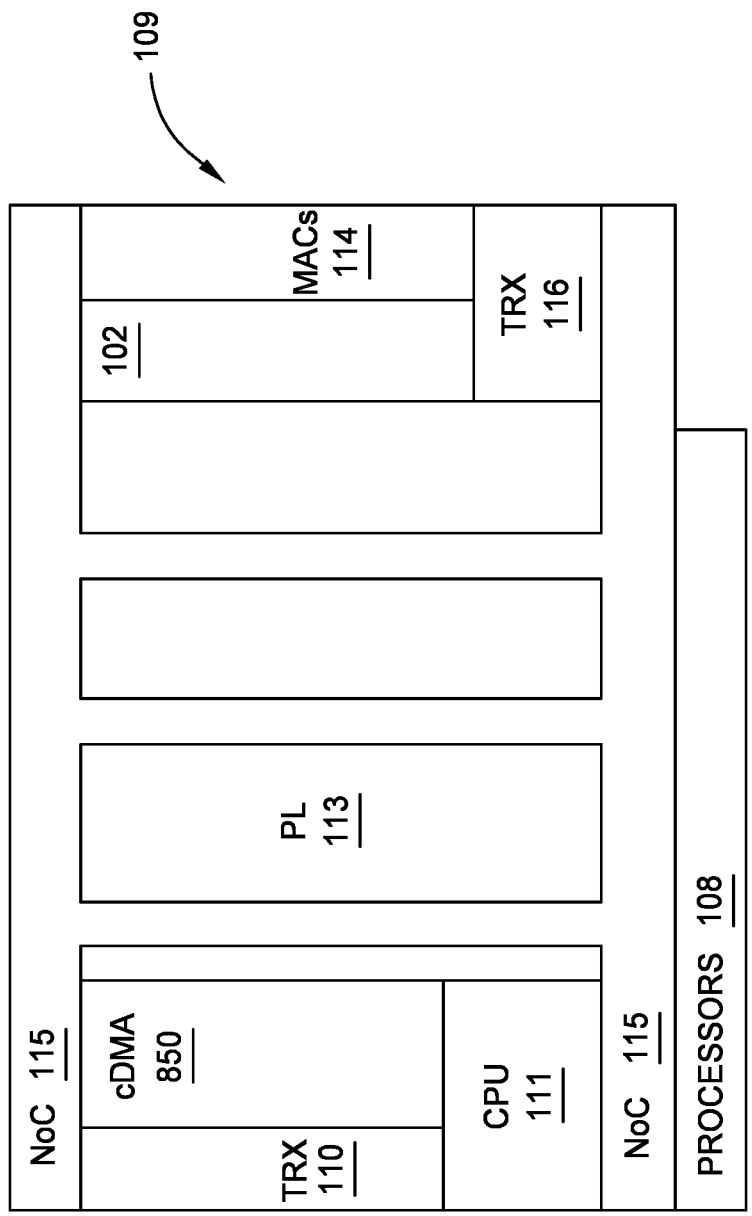
FIG. 2 shows a network interface device of some embodiments.

Reference is made to FIG. 2 which shows a network interface device 109 of some embodiments. The network interface device may be at least partially provided by one or more integrated circuits. Alternatively, the network interface device may be part of a larger integrated circuit. The network interface device 109 may be provided by a single hardware module or by two or more hardware modules. The network interface device may provide a network attached CPU in front of the main CPU. The network interface device will be located on a data path between the host CPU and the network.

The NIC may be configurable to provide application specific pipelines to optimise data movement and processing. The NIC may integrate high-level programming abstractions for network and compute acceleration The NIC of some embodiments support terabit class endpoint devices. Some embodiments may be able to support terabit data rate processing. For example the NIC may receive data from the network at a terabit data rate and/or put data onto the network at a terabit data rate. However, it should be appreciated that other embodiments, may operate at and/or support lower data rates.

The arrangement of FIG. 2 may be regarded as providing a System-on-Chip (SoC). The SoC shown in FIG. 2 is an example of a programmable integrated circuit IC and an integrated programmable device platform. In the example of FIG. 2, the various, different subsystems or regions of the NIC 109 may be implemented on a single die provided within a single integrated package. In other examples, the different subsystems may be implemented on a plurality of interconnected dies provided as a single, integrated package. In some embodiments, the NIC 109 of FIG. 2 may be provided by two or more packages, an integrated circuit or by a chiplet.

In the example of FIG. 2, the NIC 109 includes a plurality of regions having circuitry with different functionalities. In the example, the NIC 109 has a processing system provided by one or more CPUs 111. The NIC 109 has one or more first transceivers 116 for receiving data from a network and/or for putting data onto a network. The NIC 109 has one or more virtual switches (vSwitch) or protocol engines 102. The protocol engine may be a transport protocol engine. This function is referred to a virtual switch function in the following. The NIC 109 has one or more MAC (medium access control) layer functions 114. The NIC 109 has one or more second transceivers 110 for receiving data from a host and/or for providing data to a host.

Figure 6:
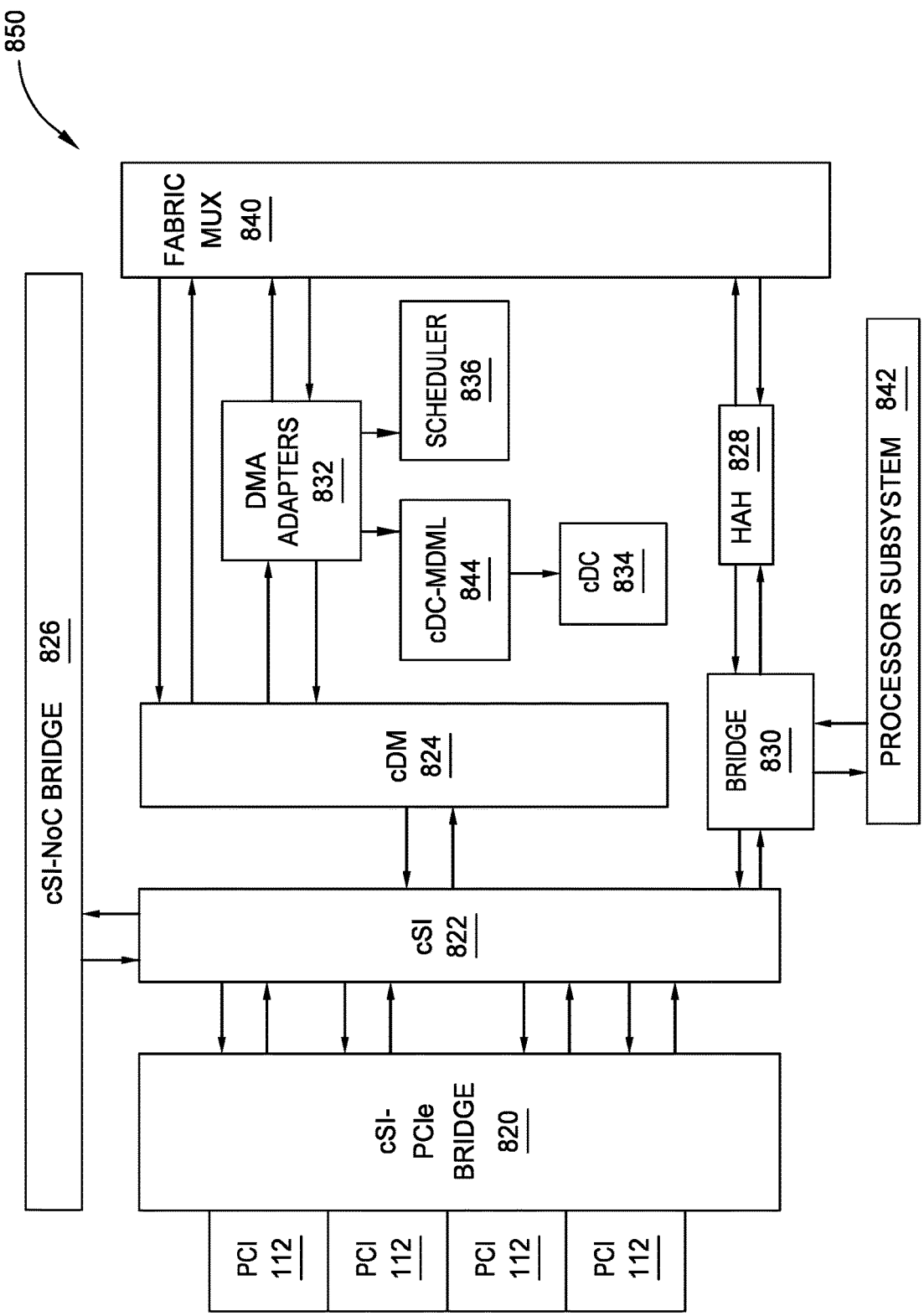
FIG. 6 shows the composable direct memory access architecture of some embodiments.

The NIC 109 has a cDMA (composable direct memory access architecture) referenced 850. In one embodiment, the various elements in the architecture 850 in FIG. 6 are formed from hardware in the NIC 109, and thus are circuitry. This block 850 is described in more detail later and may comprise a PCIe (peripheral component interconnect express) interface and one or more DMA (direct memory access) adaptors. The one or more DMA adaptors provide a bridge between the memory domain and packet streaming domain. This may support memory-to-memory transfers.

The NIC 109 may comprise or have access to one or more processing cores 108. By way of example only the cores may be ARM processing cores and/or any other suitable processing core. The CPU 111 and the one or more processing cores 108 may be provided by a common processor or by different processors.

The NIC 109 has a network on chip (NoC) 115 which is shaded in FIG. 2. This may provide communications paths between different parts of the NIC 109. It should be appreciated that two or more of the components on the NIC 109 may alternatively or additionally communicate via direct connection paths and/or dedicated hardened bus interfaces.

The area between the NoC may include one or more components. For example, the area may accommodate one or more programmable logic blocks 113 or programmable circuitry. This area is sometimes referred to as the fabric. By way of example only, the programmable logic blocks may at least partially be provided by one or more FPGAs (field programmable gate array). The area may accommodate one or more look up tables LUTs. One or more functions may be provided by the programmable logic blocks. The ability to accommodate different functions in this area may allow the same NIC to be used to satisfy a variety of different end user requirements.

It should be appreciated that in other embodiments, any other suitable communication arrangement may be used on the NIC instead of or in addition to the NoC.

The NIC provides an interface between a host device and a network. The NIC allows data to be received from the network. That data may be provided to the host device. In some embodiments, the NIC may process the data before the data is provided to the host device. In some embodiments, the NIC allows data to be transmitted by the network. That data may be provided from the host device and/or from the NIC. In some embodiments, the NIC may process the data before the data is transmitted by the network.

The virtual switch 102 may be an at least partially hardened device or part of the NIC. There may be a single virtual switch or two or more separate virtual switches provided. The virtual switch 102 is able to communicate with other blocks on the chip using the NoC and/or via direct connection paths and/or dedicated hardened bus interfaces. In some embodiments, this may be dependent on the capacity of the NoC versus the quantity of data to be transported. The NoC may for example be used for memory access by the network interface device 109. The NoC 115 may be used for delivering data to the CPU 111, the processors 108, the DMA adaptors and/or the PCIe blocks.

In some embodiments, the NoC and/or direct connection paths and/or dedicated hardened bus interfaces may be used to deliver data to one or more accelerator kernels and/or other plugins. In some embodiments, routing may be via the programmable logic. These plugins may in some embodiments be provided by the programmable logic 113 or any suitable programmable circuitry.

The virtual switch 102 may be physically located on the edge region of the NIC 109 and communicate with various other components of the NIC 109. In some embodiments, the virtual switch 102 may be arranged in physical proximity to the MAC layer functions 114 and the one or more first transceivers 116. These components may be arranged in physical proximity to the edge region of the NIC 109. The data from the network is received by the one or more first transceivers 116.

In other embodiments, the virtual switch 102, the MAC layer functions 114 and the one or more first transceivers 116 may be physically arranged away from the edge region of the NIC.

Some embodiments may allow a customized NIC function to be provided. This may be useful where a specific NIC function is required. This may be for a particular application or applications or a for a particular use of the NIC. This may be useful where there may be a relatively low volume of devices which are required to support that NIC function. Alternatively or additionally this may be useful where customization of a NIC is desired. Some embodiments, may provide a flexible NIC.

The customization may be supported by providing one or more functions using the PL 113 or programmable circuitry.

Some embodiments may be used to support a relatively high date rate.

Figure 3:
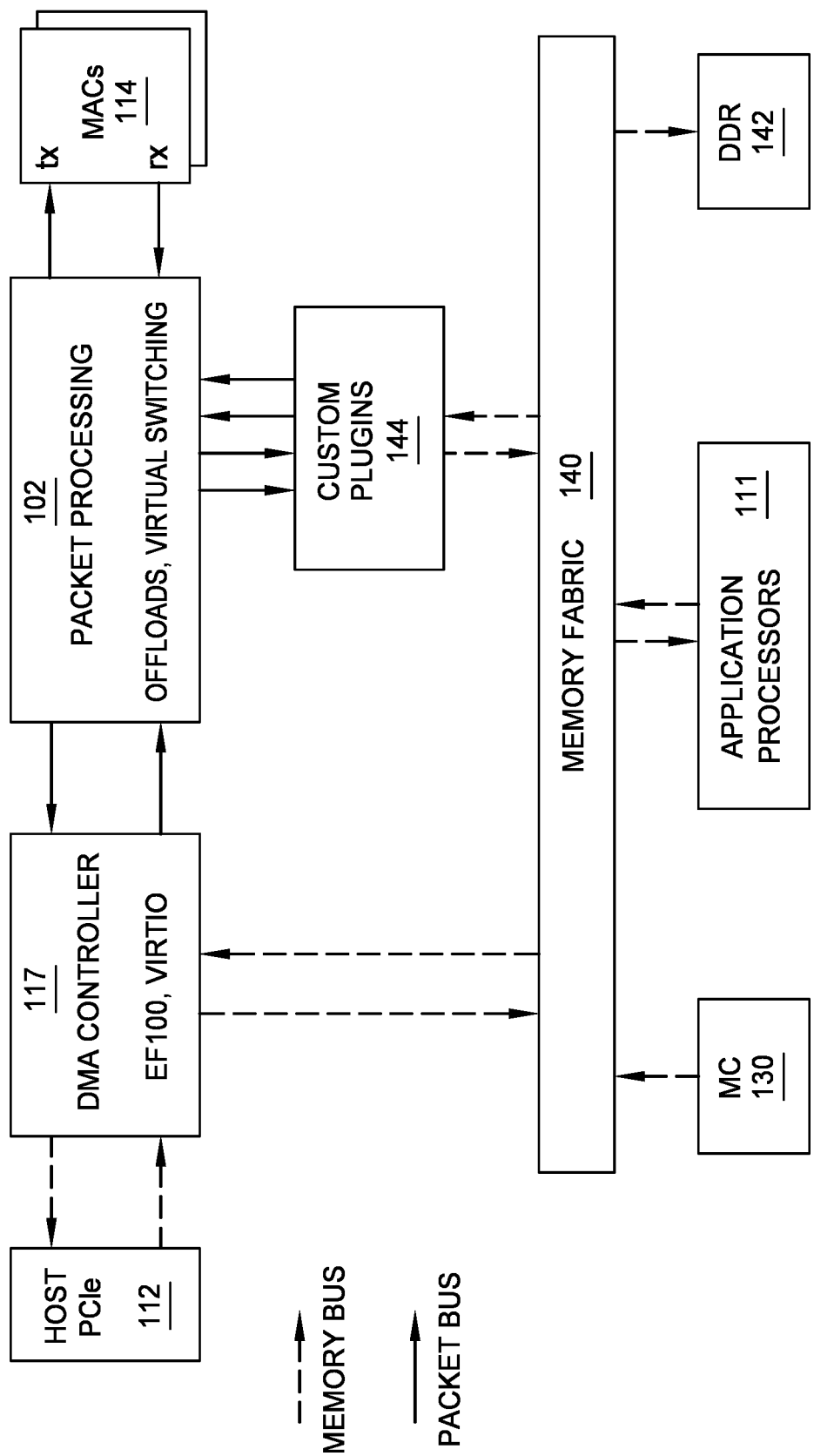
FIG. 3 schematically shows subsystems of the network interface device of some embodiments.

Reference is made to FIG. 3 which schematically shows the communication paths between the subsystems of the NIC of FIG. 2. A host PCIe interface 112 of the cDMA block and a DMA controller 117 also of the cDMA block communicate via a memory bus. The DMA controller 117 communicates via the memory fabric 140 using a memory bus. A management controller MC 130 provides control plane messages via the memory fabric 140 using a control bus. Application processors 111 communicate via a memory fabric 140 using a memory bus. Data is received at a DDR 142 via the memory fabric using a memory bus.

The DMA controller 117 communicates with the one or more virtual switches 102 via a packet bus. The one or more virtual switches may provide packet processing. The one or more virtual switches may perform offload processing and virtual switching as will be described in more detail later. The processing provided by the one or more virtual switches may be modified using one or more plugins 144. The plugins may communicate with the memory fabric via a memory bus and with the one or more virtual switches via a packet bus. The one or more virtual switches may communicate with the MACs 114 via a packet bus.

In some embodiments capsules of data may be used to transport data in the NIC. This will be described in more detail later.

Figure 4:
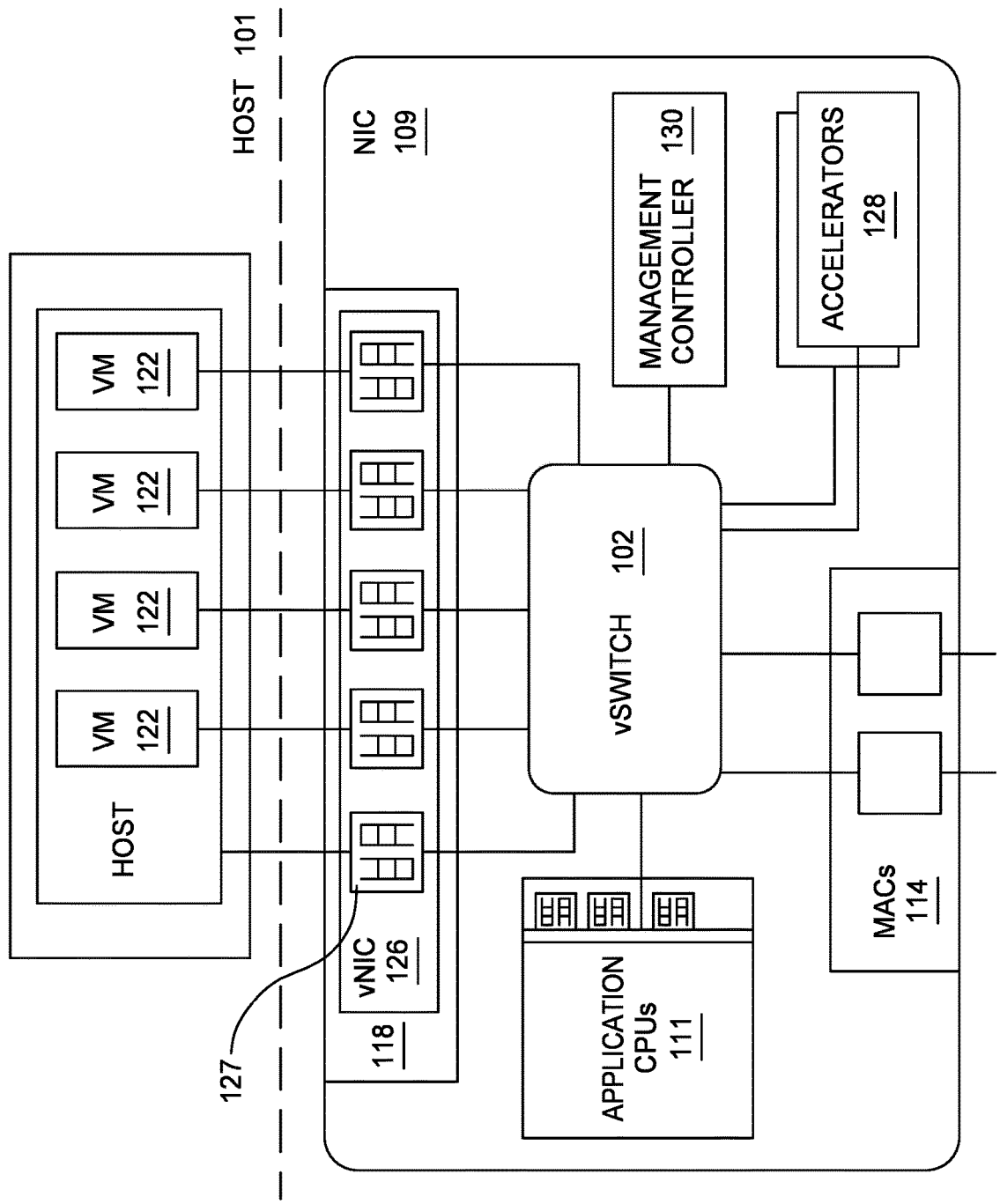
FIG. 4 shows a schematic view of a host and the network interface device of some embodiments.

Reference is made to FIG. 4 which shows a schematic view of the host device 101 and functional blocks supported by the NIC 109. The NIC 109 comprises the virtual switch function 102. This virtual switch function 102 may be extendible by one or more plugins as will be described in more detail later. The virtual switch function 102 with the plugins is able to support custom protocols and switch actions.

The host device 101 comprises a number of virtual machines VM 122.

A number of PCIe PFs (physical function) and/or VFs (virtual function) may be supported. A PCIe function 118 may have multiple virtual NICs (VNICs). Each VNIC 126 may connect to a separate port on the virtual switch. In FIG. 4 one PCIe function and one VNIC of the PCIe function is shown for clarity.

Each vNIC 126 may have one or more VIs (virtual interfaces) 127. Each VI may provide a channel for sending and receiving packets. Each VI may have a transmit queue TxQ, a receive queue RxQ and an event queue EvQ. There may be a one to one relationship between a virtual machine and a virtual function, in some embodiments There may be a plurality of VIs mapped into a VF (or PF)

In some embodiments, one of the VIs in a given PF or VF may support a function management interface.

The virtual switch 102 comprises a plurality of virtual ports. The ports may be configured to receive data from the TxQ of a VNIC and to transmit data to the RxQ of a VNIC.

The virtual switch 102 is configured to interface with one or more application CPUs provided for example by the CPU 111, the management controller 130 which is configured to control the virtual switch and one or more MAC layer functions 114. In some embodiments, the virtual switch is extendible by plugins such as previously discussed. One example of a plugin comprises a hardware accelerator 128.

Figure 5:
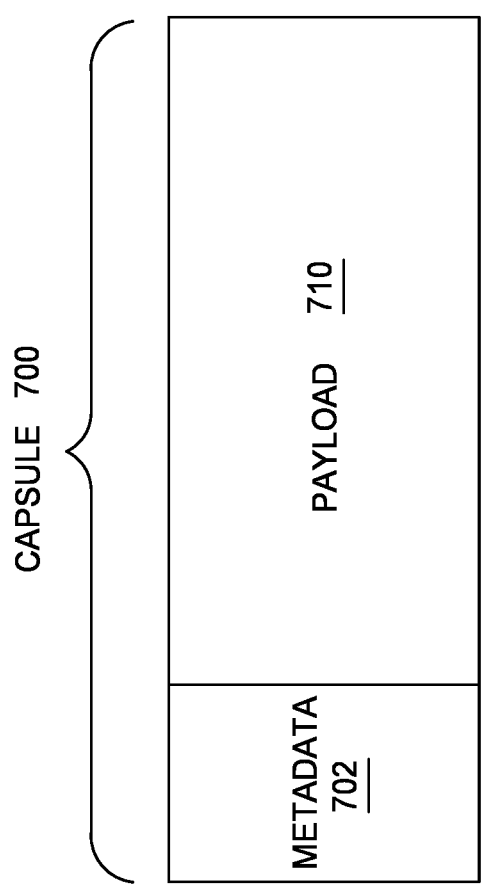
FIG. 5 shows a capsule used in some embodiments.

In some embodiments capsules of data may be used to transport data in the NIC. Reference is made to FIG. 5 which shows a capsule used in some embodiments. In some embodiments, the streaming subsystem carries capsules. As will be discussed later, the capsules may alternatively or additionally be used in other parts of the NIC. The capsules may be control capsules or network packet capsules. The payload may be provided by a pointer to a payload. Alternatively the payload may be provided in the capsule.

As schematically shown in FIG. 5, the capsule comprises metadata 702. This may be provided at the beginning of the capsule. This may be followed by the capsule payload 710.

The metadata may depend on whether the capsule is a control capsule or a network capsule.

A network packet capsule has capsule metadata followed by for example an ethernet frame in the payload.

The metadata may comprise a capsule header which may be common to the control capsule and the network capsule. The capsule header may comprise information indicating if the capsule is a control capsule or a network packet capsule. The capsule header may comprise route information which controls the routing of the packet. The capsule header may comprise virtual channel information indicating the virtual channel to be used by the capsule. The capsule header may comprise length information indicating the length of a capsule.

The network packet capsule will have a network capsule header following the capsule header as part of the metadata 702. This may indicate the layout of the capsule metadata and if the capsule payload includes or not an Ethernet FCS (frame check sequence).

The metadata for the control capsule may indicate the type of control capsule. The capsules may have meta data to indicate offsets. This may indicate the beginning of the data to process.

Some embodiments may use a segmented bus. A segmented bus is a streaming bus where the overall data path width is split into physically distinct pieces. Each segment has its own principal control signals (for example SOP (start of packet) and EOP (end of packet)). A segmented bus may be used to overcome potential inefficiency of any bus of fixed width carrying capsules of arbitrary size. Without segmentation, if a capsule is (say) one byte longer than the bus width, 2 bus beats (clock cycles) will be required to carry the capsule; the entire bus save for one byte carries nothing on the second beat. A segmented bus allows the next capsule to begin transmission in the second bus beat in the example above, recovering much of the wasted bandwidth. As the number of segments increases, the bus bandwidth for an arbitrary capsule size trends towards 100% of its theoretical maximum. However this needs to be balanced against the complexity and resources of the multiplex and demultiplex operations required with increased segmentation. The number of segments and segment widths can vary with the constraints.

In some embodiments the bus may be divided into 4 segments, but this can vary depending on how strong the constraints are.

The frame size may be modified and/or the number of segments which are supported by the bus width.

Some embodiments may be arranged to allow data to be passed across the NIC at relatively high rates between a plurality of different data sources and sinks. This may be using the network-on-chip NoC architecture discussed previously.

Some embodiments may provide a composable DMA (cDMA) architecture to facilitate the passing of the data. The composability may allow different elements of a DMA system can be added, and/or the capabilities of endpoints altered without having to re-design the system. In other words, different DMA schemes with different requirements can be accommodated by the same composable DMA architecture.

The architecture is provided to be scalable and/or adaptable to different requirements. The architecture is configured to support the movement of data between the host and other parts of the NIC. In some embodiments, the architecture can support relatively high data rates.

Reference is made to FIG. 6 which shows an example of a cDMA architecture of some embodiments.

The arrangement schematically shown in FIG. 6 allows data to be passed between different sinks (destinations) and data sources. By way of example only, the sinks and data sources may comprise one or more of the following:

One or more PCI connected hosts. These would be connected via the PCIe controllers 112;

One or more processor subsystems 842. This may be the CPU 111 and/or the processors 108 shown in FIG. 2 or and/or one or more different processors;

the vSwitch 102 shown in FIG. 2;

DDR memory;

A data movement engine provided by the NIC. This may be provided by one or more accelerators such as previously discussed;

One or more fabric client(s);

Memory; and

Any other suitable sink or data source.

The sinks and/or data sources may be dependent on the system in which the NIC 109 is provided and/or the function which needs to be provided by the NIC 109.

The cDMA 850 may be regarded as a layered architecture. A base layer may connect different devices, bus widths and protocols to the cDMA system. A composable scalable interconnect (cSI) 822 may allow data to be moved between the interfaces. A data mover cDM 824 may perform bulk data movement between the interfaces under the direction of one or more schedulers 836. As well as bulk-data, the cDM may provide a message load/store interface which allows small messages to be transferred e.g. for interrupts or descriptor management.

DMA adapters 832 may provide the API (application programming interface) for the required types of DMA (interpreting descriptors and managing the state of rings etc.), using the data mover to fetch descriptors and move data around. A shared descriptor cache system cDC 834 may allow adapters to share temporary storage for descriptors in flight. A host access handler HAH 828 may manage PCIe target transactions, bar/device/function mappings and doorbell management. For example the HAH may manage doorbell coalescing, sampling, and forwarding.

One or more relatively high bandwidth memory interfaces may be supported. The one or more memory interfaces may provide an interface one or more DDRs.

One or more of the previously described accelerators may want to access the host and/or the high bandwidth memories.

The host may want to access the high bandwidth memories.

Bridges may be used to interconnect the cDMA architecture to other parts of the NIC. In general bridges act as protocol translators, and generally do not initiate or terminate traffic. The bridges may provide protocol translation to other bus types. For example, the NoC may have a proprietary master/slave interface or the processor subsystem may support an internal AXI interconnect A bridge may also act as bus width translators. Examples of bridges are a cSI-NoC bridge 826, a processor bridge 830, and a cSI-PCIe bridge 820, and cSI-AXI bridge.

The cSI-NoC bridge 826 may be provided to extend the cSI 822 over the NoC in a streaming mode.

In some embodiments a bridge to a bus may be provided. In some embodiments an AXI bus (or other suitable bus) may be used and cSI-AXI bridge (not shown) may be provided.

The processor bridge 830 may provide an interconnection to the one or more CPUs of the NIC, for example a processing subsystem 842. The processor bridge may contain the cSI-AXI bridge or other bus bridge and/or other components. This processor bridge may be provided between the HAH 828 and the cSI 822.

The cSI-PCIe bridge 820 connects a PCIe controller 112 and the cSI 822. A cSI-PCIe bridge acts as a cSI target (that is a target of the cSI), forwarding requests from cSI initiators (that is an initiator of a request to the cSI) to a PCIe controller requester interface. This bridge also acts as a cSI initiator, forwarding requests from a PCIe controller completer interface to cSI targets (that is a target of the cSI).

In the example, shown in FIG. 6, there are four PCIe controllers. This is by way of example only and different numbers of PCIe controllers may be provided. A cSI-PCIe bridge instance may be associated with each one of the four PCIe controllers. More or less than four PCIe controllers may be provided in other embodiments A fabric multiplexer 840 brings together the components of cDMA with the components that require fabric and NoC access to be shared. The DMA adaptors 832, cDM 824, HAH 828 and/or any other suitable component may be provided with a path to/from the fabric. The fabric multiplexer 840 may be configured to have more than one path active at the same time. This may be dependent on the number of input/output pins of the fabric.

The cDMA makes use of capsules such as previously described. The capsules are data entities which flow through the streaming fabric. The capsules contain metadata and data. The data portion may be PCIe TLP (transport layer protocol). The metadata contains supplementary routing information (for example derived from the TLP itself and/or other context) and/or other fields used to control the flow of capsules in the cSI system. Capsule headers may include PCIe TLP header data and may comprise additional routing and flag information.

Figure 7A:
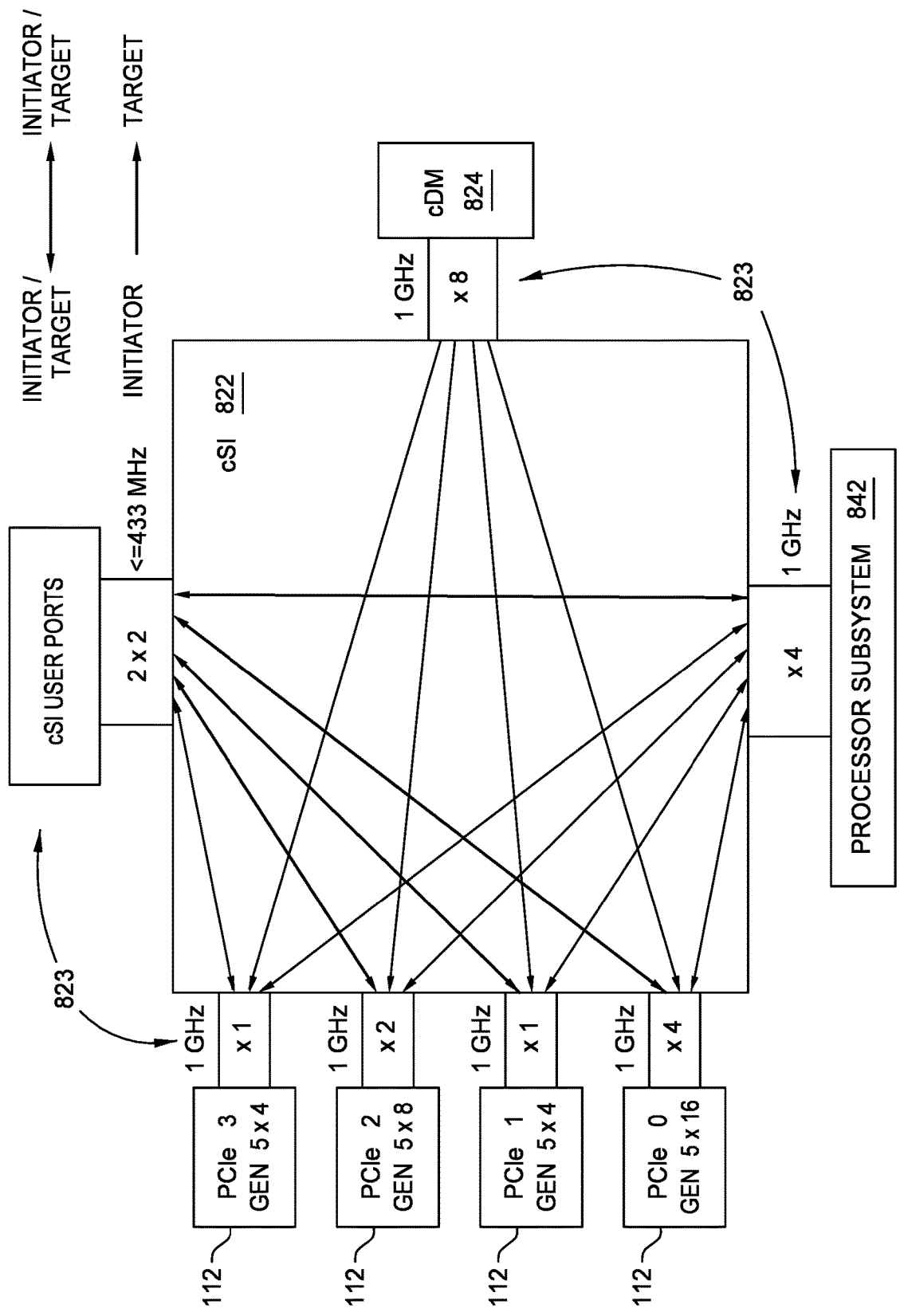
FIG. 7a schematically shows the interfaces of the composable scalable interconnect (cSI) of some embodiments.
Figure 7B:
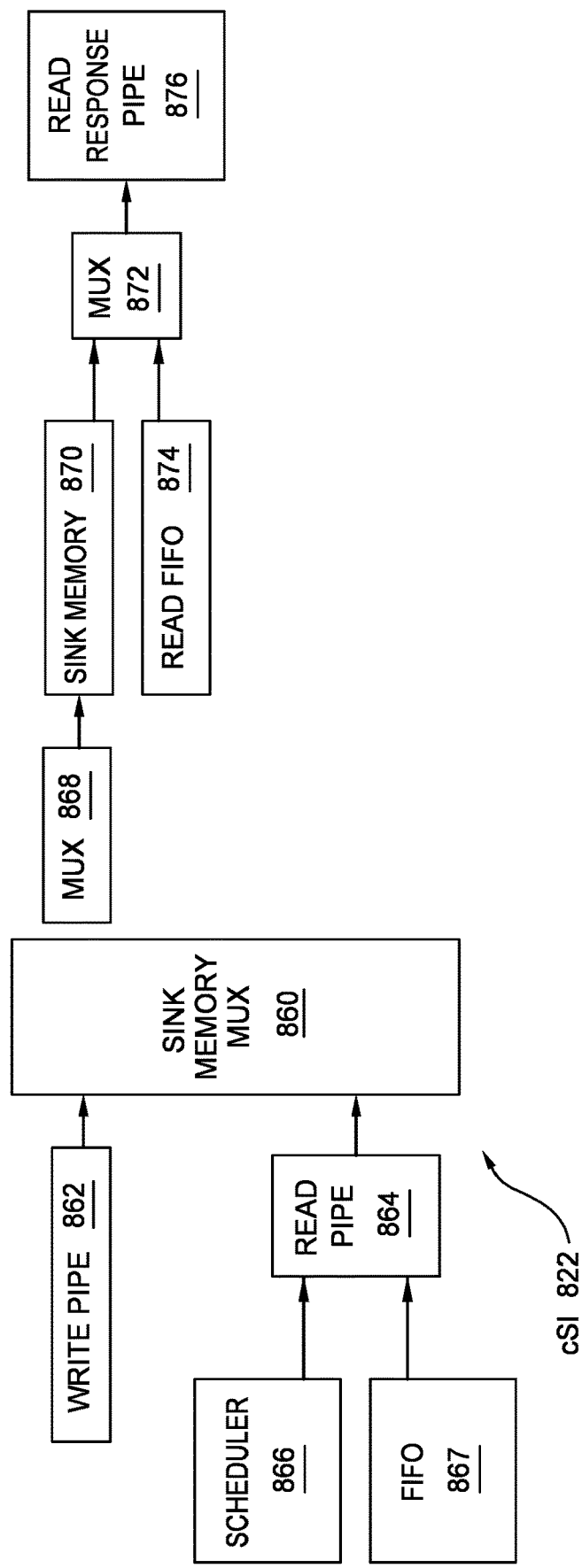
FIG. 7b shows the composable scalable interconnect (cSI) of some embodiments in more detail.

Reference is made to FIG. 7a and FIG. 7b which schematically shows the cSI 822 introduced in FIG. 6. The cSI 822 sees clients as capsule sources and sinks where a source sends capsules into the cSI 822 and the sink receives capsules from the cSI 822. At a system level, clients of the cSI (cSI clients) are initiators and/or targets. Both the initiator client and the target client may implement respective interfaces to the cSI.

As shown in FIG. 7a, the cSI 822 is an N×M streaming fabric connecting N capsule sources to M capsule sinks. N and M may be the same or different number. The cSI 822 provides connectivity between initiators and targets by transporting memory read requests, memory write requests, completions, and/or other types of transactions. The cSI 822 may provide PCIe-like connectivity in some the embodiments. The cSI 822 may be considered to provide a transport medium. The cSI 822 can be regarded as a source-routed switch matrix, allowing traffic from multiple sources to be routed to multiple sinks. The sources and sinks do not necessarily have the same bus widths or data rates.

As shown in FIG. 7a, the cSI 822 has interfaces 823 to the cDM 824, the PCIe interfaces 112 (via the PCIe bridge), the processor subsystem 824 (via the bridge 830) and user ports for the cSI which may be provided in the fabric (these may bypass the cDM). The interfaces may be a sink interface, a source interface or both a sink interface and a source interface. The interfaces shown in FIG. 7a are by way of example only and different embodiments may comprise different interfaces. It should be noted that the notation ×1, ×2, ×4 and ×8 schematically represents the number of bus segments supported by the respective interface, in FIG. 7a.

The interface with the cDM 824 may support 8 bus segments with the interface with processor subsystem supporting 4 segments. The interface with the user ports for the cSI may support 2×2 I segments.

Capsules passing from a specific source to a specific sink are segregated into mutually non-blocking flows based on capsule type and virtual channel assignments. Capsules in the same flow are delivered in order and are not blocked by capsules belonging to another flow.

Capsules may be passed into and out of the interconnect over segmented streaming buses. The segment size is may be any suitable size, for example 20B. In other embodiments, the segments may be larger or smaller than this example size.

The cSI capsule header size is in some embodiments 28B, and therefore two segments are required for small capsules such as read requests and writes or completions with small payloads. The cSI capsule header size may be larger or smaller than 28B. In some embodiments, the cSI capsule header size may be accommodated in one or more segments.

The number of segments used by each bus depends on the performance requirements of the interface. Buses carrying only NPR (non-posted request including read requests) flows may be one segment wide. This may be the case since NPR capsules are small and therefore do not need as much bandwidth as PR (posted requests including writes) and CMPT (completions which include read data) flows.

Virtual Channels (VC), when provided, exist between one source and one sink. Having more than one VC provisioned between a source and a sink for given capsule type allows multiple non-blocking flows (one per VC) to exist for that capsule type between the source and the sink. In this regard, reference is made to FIG. 7c which shows three virtual channels VC0, VC1 and VC2.

Segmented buses, such as previously discussed may be used in some embodiments.

cSI capsule flow has the following two stages:

From source client to the cSI buffers (sink memory buffers). A source client can write to one or more or even many different buffers.

From cSI buffers (sink memory buffers) to destination client. A buffer can be read by one sink client in some embodiments.

Figure 7C:
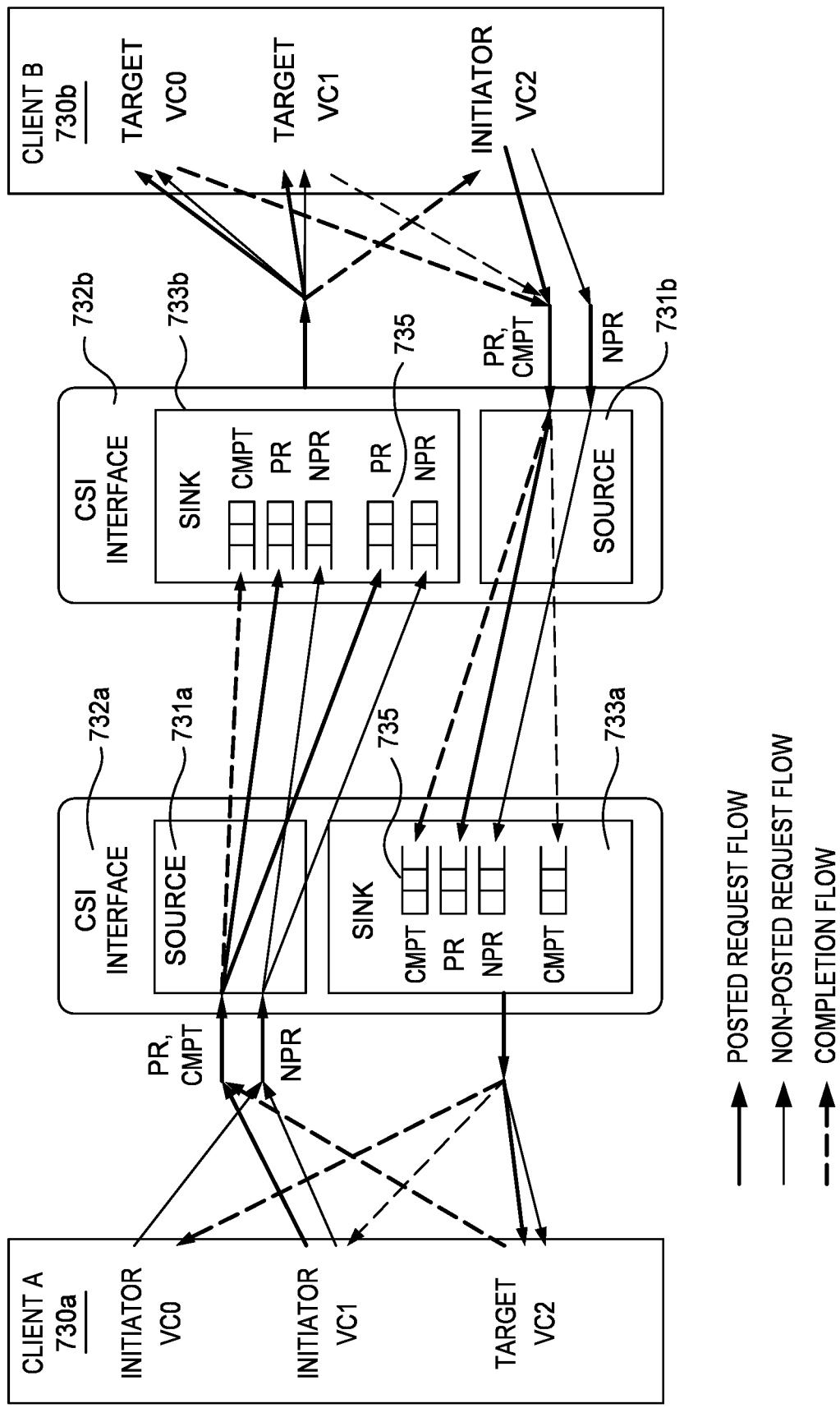
FIG. 7c shows example virtual channels of the composable scalable interconnect (cSI) of some embodiment.

In the example shown in FIG. 7c, a first client 730a of the cSI interfaces with an interface 732ab of the cSI 822. That cSI interface 732a has source 731a and a sink 733a. A second client 730b of the cSI interfaces with an interface 732b of the cSI 822. That cSI interface 730b has a source 731b and a sink 733b. The sinks 733a and 733b have a number of sink buffers 735. VCs support independent flows of requests, with separate buffering, flow control, ordering domains and quality of service. A VC may comprise a PR flow and an NPR flow going from initiator to target, and a CMPT flow going from target to initiator. The arrangement of FIG. 7c has 2 VCs from the first cSI client 730a to the second cSI client 730b—VC0 and VC1. The arrangement of FIG. 7c has 1 VC from the second cSI client 730b to the first cSI client 730a—VC2. The sink 733a of the first interface 732a has a CMPT buffer for VC0 and CMPT buffer for VC1 as well as a PR buffer and NPT buffer for VC2. The sink 733b of the second interface 732b has a CMPT buffer for VC2 as well as a PR buffer and NPT buffer for each of VC0 and VC1.

The cSI 822 may have one or more throughput characteristics:

A sustained throughput from any source to any accessible cSI sink buffer of the source may be provided. This may match the full bandwidth of the source.

An output may be provided from any cSI sink buffer to the corresponding sink client. This may match the full bandwidth of the sink Multiple sources may have throughput to the same sink. cSI may allow the scaling of bandwidth.

The cDMA takes the data flows in a system and connects them as required. Differences in peak data rates may be managed by using a collection of segmented busses with scheduled traffic flows. This may be a function of the cSI 822, which acts as a source-based router for flows in the cDMA system. The cSI may also enforce ordering rules. This may reduce the complexity of the bridges. This may avoid possible deadlock conditions.

The cSI may address issues relating to the scaling up to the bandwidth requirements for network interfaces. Based on a modular approach, the cSI allow a flexible data path to be constructed incorporating multiple data sources, sinks and types of data mover.

cSI interfaces may be exposed to the programmable logic (fabric) and/or the NoC.

Credits may be used and provide a flow control mechanism where a data producer advertises an amount of data and a consumer advertises an amount of space available. Credit updates are carried by credit messages from consumer to producer or from producer to consumer, depending on the scenario. The exact value of a credit may change in different contexts and may be a number of bytes, segmented bus segments, response reassembly buffers, or other values established for the context. Credits and credit contexts are managed by respective schedulers.

Reference is made to FIG. 7b. The cSI is provided with a plurality of write pipes 862 (only one of which is shown in FIG. 7b for clarity) and a plurality of read request pipes 864 (only one of which is shown in FIG. 7b for clarity). Each read request pipe 864 is associated with a sink scheduler 866 and a job information FIFO (first in first out buffer) 867. The write pipe and the read request pipe will be described in more detail later. A write pipe will output a write request to a sink memory multiplexer 860 and the read request pipe will output a read request to the sink memory multiplexer 860.

The sink memory multiplexer 860 sees all write and read requests from all write and read pipes and choses which can proceed to the sink memory buffers and which are back pressured.

Some source clients may be furcated into sub-busses using the bus segmentation.

A cSI source or sink interface can be split into multiple interfaces or "furcated". In the following example, a 4 segment bus is used. The segments may be used singly or in combination.

An ×2 interface (source interface using a two-segment bus or sink interface using two-segment bus) can be furcated into two ×1 interfaces (using one bus segment).

A ×4 interface (source interface using a four-segment bus or sink interfaces using a four-segment bus) can be furcated into two ×2 interfaces or four ×1 interfaces or even two ×1 interfaces and one ×2 interface.

In this example of a four segment bus, a furcated interface bus is statically allocated one, two or four segments (depending on the type of furcation and the original interface width) from the original interface. In this example, the furcated interface produces 2, 3 or 4 fully independent interfaces.

In some embodiments an interface may be allocated $2^n$ segments where n is an integer equal to 0 or more. The value of n may be determined by the total number of bus segments. In the example where there a maximum of 4 bus segments, n may be 0, 1 or 2. In some embodiments, there may be a total number of $2^n$ bus segments where n is an integer. Whilst the example has a total of four bus segments, it should be appreciated that other examples may have a different total number of bus segments.

In other embodiments, an interface may have a ×3 interface made up of three bus segments or any other suitable number of bus segments.

The number of bus segments allocated to an interface, in alternative embodiments may not be an integer power of 2. The total number of bus segments in alternative embodiments may not be an integer power of 2.

As shown in FIG. 6 the cSI 822 interconnects one or more of the following clients.

The cSI-NoC Bridge 826. For example, this may be a 512 Gb initiator/target with furcation support. cSI allows this client to become two 256 Gb initiator/target clients or four 128 Gb initiator/target clients or one 256 Gb initiator/target client and two 128 Gb initiator/target. This supports an 1×4 interface or 2×2 interfaces or 4×1 interfaces or 2×1 interfaces and 1×2 interface. It should be appreciated that the 512 Gb value is by way of example only, and other embodiments may use a different value, which may alter the sizes of an interface and/or the number of supported interfaces.

The processor bridge 820. For example this may be a 512 Gb initiator/target or other value. It should be appreciated that the 512 Gb value is by way of example only, and other embodiments may use a different value, which may alter the sizes of an interface and/or the number of supported interfaces.

PCIe Bridge 820. For example this may be a 512 Gb initiator/target (or other value) with furcation support. The cSI allows this client to become two 256 Gb initiator/target clients or four 128 Gb initiator/target clients or one 256 Gb initiator/target client and two 128 Gb initiator/target. This supports an 1×4 interface or 2×2 interfaces or 4×1 interfaces or 2×1 interfaces and 1×2 interface. It should be appreciated that these values are by way of example only. Other embodiments may use a different value, which may alter the furcated sizes.

It should be appreciated that 512 Gb is by way of example only, and other embodiments may use a different value, which may alter the furcated sizes and/or the total number of segments. Where a different value to 512 Gb is used, this may be greater or less than 512 Gb.

cDM −800 Gb initiator. It should be appreciated that 800 Gb is by way of example only, and other embodiments may use a different value. This may be furcated in some embodiments. The different value may be greater or less than 800 Gb in some embodiments. In some embodiments, the value may be the same as the previous discussed clients. However, in other embodiments, the cDM initiator may be associated with a larger Gb value than the other clients.

In some embodiments, to ensure that the number of inputs/outputs following furcation remains the same, one or more of the following techniques may be used:

All furcated interfaces use the same local credit and scheduler resource message buses as the original interface. Messages belonging to different furcated interfaces are multiplexed on the same message bus.

Furcated source interfaces use the same NPR (non-posted request) bus as the original interface. Capsules belonging to different furcated source interfaces are multiplexed onto the same NPR bus.

In one example of a furcated operation, the cSI may receive data on a 1×4 interface from a data source which is intended for two different data sinks. The cSI may have a 1×2 interface with one of the data sinks and a 1×2 interface with the other data sink.

Join operations may be supported. This is where two or more interfaces are combined. For example, the cSI may receive data on an 1×2 interface from a first source for a first data sink and data on an 1×2 interface from a second source for the first data sink. The cSI may have an 1×4 interface with the first data sink. The data from the two sources may be both sent on the 1×4 interface.

However, the furcation cases may make no difference to the write pipe arrangement since each source sink may process at most a given maximum number of simultaneous segments needing to be written to sink memory and at most a given maximum number read requests that need to be simultaneously presented to the sink memory. In some embodiments, the given maximum number may be 4. In other embodiments, the given maximum number may be more or less than 4.

A first set of a plurality of multiplexers 868 are provided downstream of the sink memory multiplexor. Only one of these multiplexors of the first set is shown in FIG. 7b for clarity. The sink memory multiplexor 860 will direct the read and write requests to the required multiplexer of the first set of multiplexors. The output of the each of the first set of multiplexers is provided to a respective sink memory 870. The sink memories may take any suitable form. In some embodiments, the sink memories may comprise single ported one segment wide RAMs. In other words, the width of the RAMs matches the size or width of a bus segment.

The output of two or more of the sink memories 870 is output to a multiplexor 872 of a second set of multiplexors. Again only one of the second set of multiplexors is shown for clarity. Each multiplexor 872 of the second set of multiplexors is controlled by an output of a respective read control FIFO 874. The number of multiplexors in the first set of multiplexors may be greater than the number of multiplexors in the second set of multiplexors. The multiplexor 872 of the second set of multiplexors provides an output to a respective read response pipe 876 which will be described in more detail later.

In one embodiment, a first pair of the first set of multiplexers 868 provide an output to respective sink memories 870 which in turn provide respective outputs to a first multiplexor of the second set of multiplexors 872. This arrangement may be repeated for a second pair of the first set of multiplexors providing an output to respective sink memories which in turn provide a respective output to a second multiplexor of the second set of multiplexors and so on.

The write request that make it to memory require no further processing.

Figure 8:
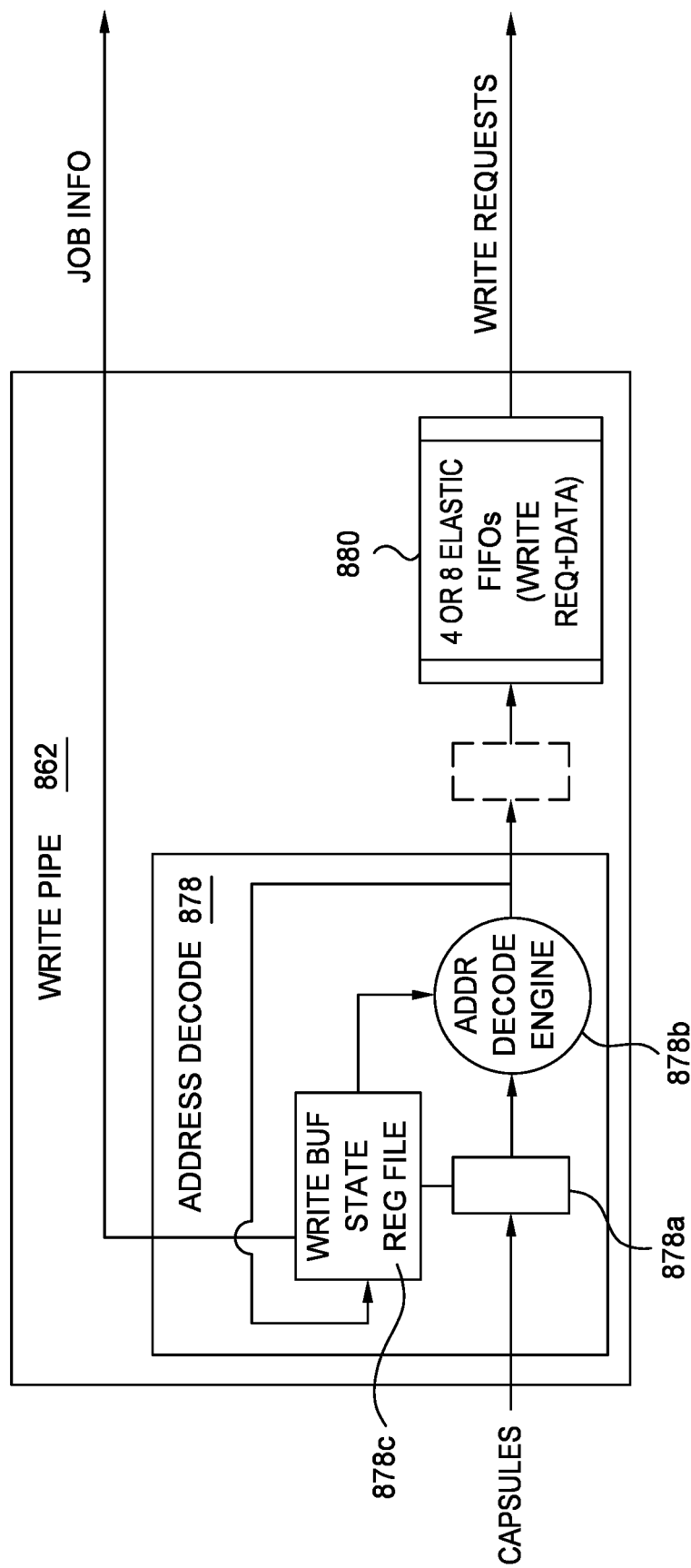
FIG. 8 shows a write pipe of the cSI of FIG. 7b.

The read requests produce read data, which is collected into read response pipes, one for each sink client Reference is made to FIG. 8 which schematically shows an example of a write pipe of FIG. 7b. One write pipe may be provided for each source client. The write pipes accept capsules from source clients. The write pipe has an address decode part 878. The address decode part or stage comprises an input buffer 878a, an address decode engine 878b and a write buffer state register file 878c. The address decode part 878 determines, for a capsule, the target sink memory and the target sink buffer. The address decode part may consult the state of the target buffer. The address decode part may associate a sink memory address with each capsule segment. The address decode part may update the state of the target buffer. The address decode part may pass the write requests to the sink memory multiplexer via a FIFO 880. The output of the write pipe is provided by a capsule segment with a width corresponding to the width of a bus segment. The sink memory address may identify the memory bank of the sink memory as discussed later.

In more detail, control logic in the address decode part 878 monitors capsules appearing on the ingress bus. The logic inspects capsule header(s) and determines the target circular buffers for the capsules. The target buffer depends on capsule type and the virtual channel VC of the capsule.

The control logic inspects the buffer state (start, end, and write pointer), maintained in the block register file, and calculates the bus segment's write address in the sink memory.

The control logic in the address decode part may perform the above actions for all the segments of the bus in parallel.

The address decode part 878 handles read job-chunk boundary discovery and job notify messaging for each buffer. A job chunk is the amount of data the sink scheduler expects to be read from the buffer for each job request. The chunk may be approximately 1 KB extended up to nearest capsule or any other suitable chunk size. For each completed (fully written) job chunk the address decode part pushes a job notify message to the job information FIFO. A parallel job information FIFO may be provided for each buffer. The job notify message may have one or more of the following arguments: buffer ID and job-chunk length in segments. Each job information FIFO may be sized to match the size of the corresponding buffer.

The address decode part 878 may maintain a job-chunk complete timer per buffer. When a buffer starts receiving a new job-chunk the timer is armed. If the job-chunk does not complete within allotted time (i.e. timer expires) the address decode part acts as if the job-size is reached. If all jobs are incomplete, it is possible to fill the job chunk information FIFO before filling the corresponding buffer. Thus, the logic stops the timer if the corresponding job chunk information FIFO fill level reaches a threshold. The timer continues after the FIFO fill level falls below threshold. This condition may trigger a blocking stall.

The address decode part thus handles the job notify messaging for each buffer and provides a job information output which is provided to the respective job information FIFO.

The write pipe has a FIFO 880. There may be a dedicated FIFO for each bus segment. This may smooth transient delays caused by segment address collisions. The FIFOs enables all segments of the address decode part to move at the same time which may simplify the address decode logic. The output of the write pipe is thus a bus segment width and can be written in one operation to a cell of the sink memory. This memory cell has a width equal to a bus segment width).

Figure 9:
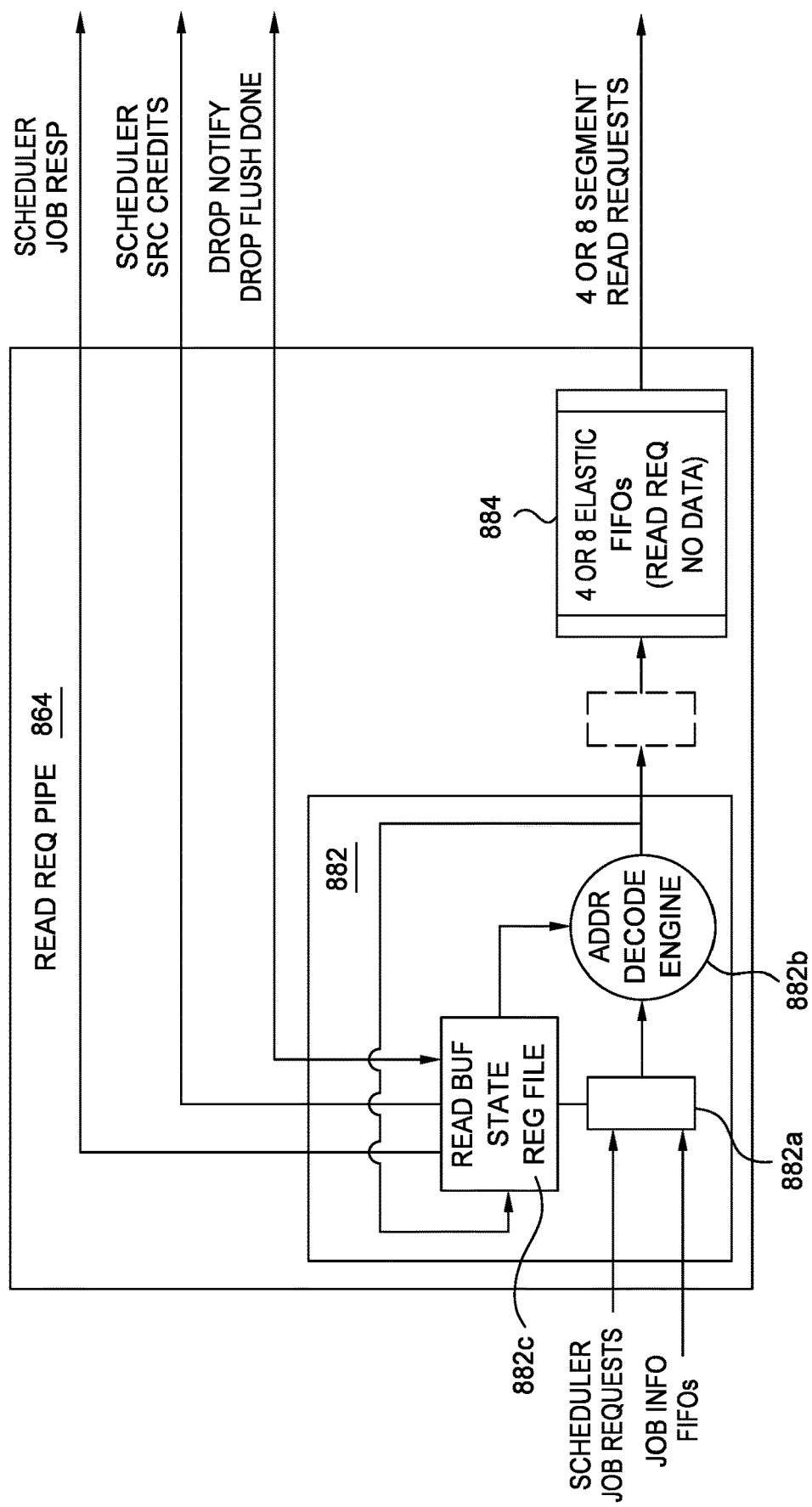
FIG. 9 shows a read request pipe of the cSI of FIG. 7*b*.

Reference is made to FIG. 9 which schematically shows a read request pipe 864 of FIG. 7b. There may be one read request pipe for each sink client. The read pipe receives job requests from sink schedulers (one scheduler for each sink client). The read pipe may consult the state of the buffer (sink memory) that the scheduler instructs the pipe to read. The read pipe may generate read requests. The read pipe may update the state of the buffer. The read pipe may pass the read request to the sink memory multiplexer.

The read request pipe has an address decode part 882. The address decode part or stage comprises an input buffer 882a, an address decode engine 882b and a read buffer state register file 882c.

The address decode part receives job requests from the sink scheduler 866. The job request asks the read stage to read a job-chunk of data from a specific location. This specific location may be a specific RAM cell or other memory cell, or managed data structure such as a linked list, circular queue, or virtual FIFO. The request carries the buffer ID and the destination ID. A client may be permitted to have one or more outstanding job requests to the same or different buffers.

The address decode part receives job information which has been produced by the write stage (such as shown in FIG. 8) from the job information FIFO.

The job information allows the address decode part to transition from job to job (from buffer to buffer) without any overhead i.e. the stage does not over run the end of a job because it knows the job chunk length from the job information.

The job information allows the address decode part to process multiple job chunks during the same scheduler job request if the chunks are smaller than the default chunk size (due to job chunk filling timeouts in the write stages).

The job information allows the address decode part to know the state of the buffer at the job end, since the job information contains the length of job chunk in segments.

Upon completion of each job request, the address decode part generates a job response to the sink scheduler—the scheduler job response. The response carries source credit, cost, and resource credit fields.

During each active job execution cycle, the address decode part constructs up to 4/8 (or any other suitable number) simultaneous sequential read requests to the same sink memory circular buffer. The first and/or the last cycle of a job may have fewer than 4/8 (or any other suitable number) simultaneous requests because of alignment. On any given cycle only requests belonging to one job may be issued. This may be the case even if two sequential jobs are targeting the same buffer.

If the request address decode part services a furcated sink interface it may be able to process one job for each furcated interface simultaneously. Each furcated interface will be associated with one or more particular bus segments.

During each active job execution cycle, the address decode part constructs a request context and pushes it into the request context FIFO 884 to be collected by the response stage. The request context describes the request stage transaction i.e. which one of the read requests are valid etc.

In the case of a furcated interface one request context FIFO is used for each furcated interface.

If a capsule is dropped by the read request pipe, the read response pipe will issue a drop notification. This may be done where a capsule violates ordering rules. In this case the response pipe will continue dropping all the following capsules from the same buffer until read request pipe stops capsule flow from the buffer and notifies the response pipe using a flush done message.

The read request pipe may see two capsule drop notifications for every notification message issued by the client. One message is delivered directly bypassing the job request FIFO and the other is received via the same FIFO as the job request. The first message allows the address decode part to react to the notify immediately and the second message tells the address decode part that there are no more pipelined job requests for the affected buffer.

Figure 10:
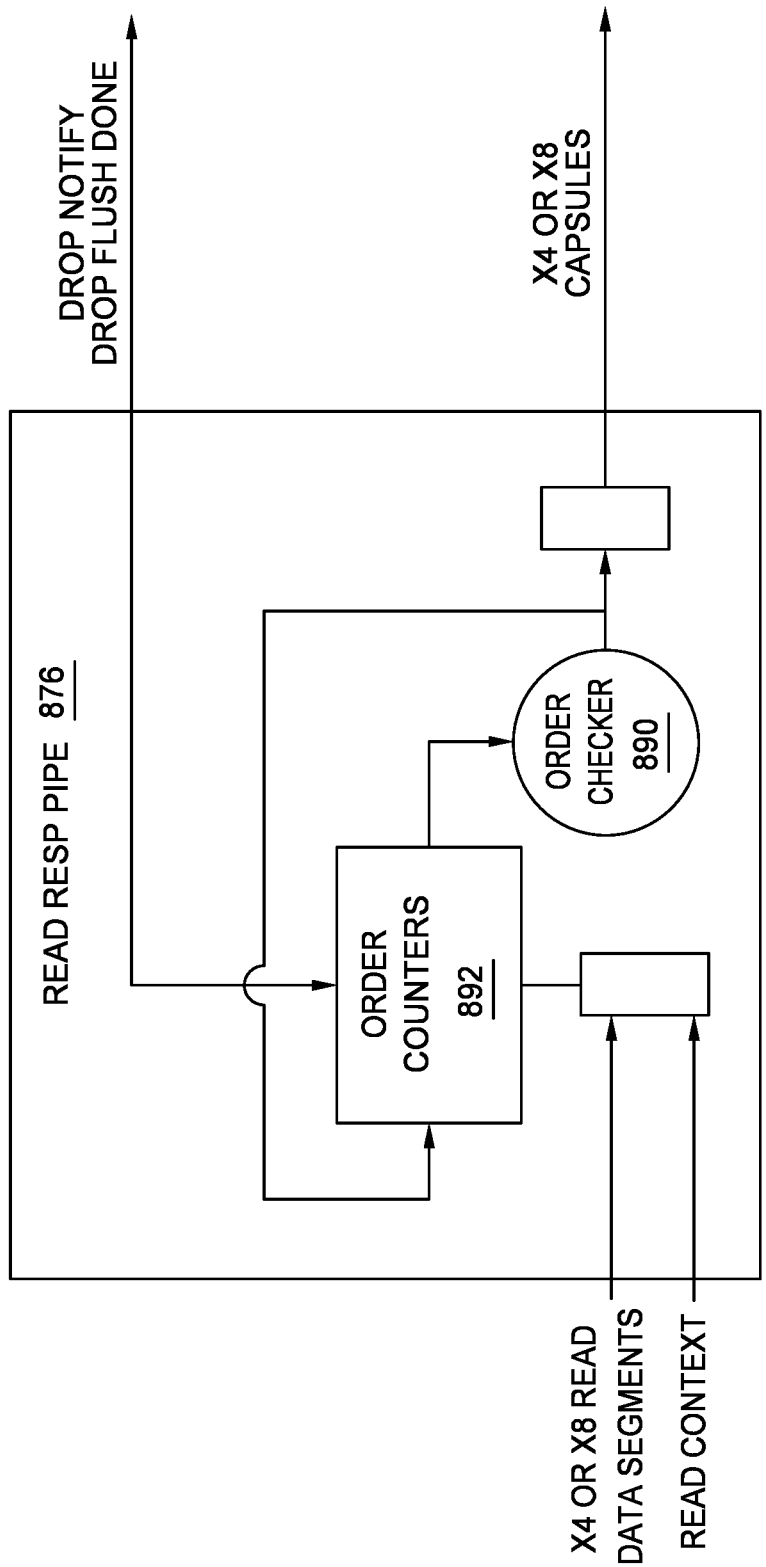
FIG. 10 shows a read response pipe of the cSI of FIG. 7*b*.

Reference is made to FIG. 10 which shows a read response pipe 876. The read requests produce read data, which is collected into a number of read response pipes, one for each sink client. The read response pipe receives read data responses from the sink memories and the corresponding context from the read stage. The request context tells each response stage segment register which memory or RAM is to receive the data from and whether the data is valid. The read response pipe sees the same buffer segments in order. For each capsule the read response pipe updates/verifies order state using an order counter 892 and order checker 890 respectively. If the capsule is found to not be in order the pipe drops the capsule without passing it to the sink interface and notifies the read request pipe. The read response pipe continues to drop all capsules from the affected buffer (without issuing any more notifies) until the read response pipe sees a flush done message from the read request pipe.

On every cycle, the sink memory multiplexer 860 considers all write and all read requests to sink memories. The arbiter of the sink memory multiplexer 860 can make decisions for each sink memory in parallel since they are independent. In some embodiments there may be 8 sink memories. In other embodiments, there may be more or less than 8 sink memories. A sink memory may comprise a bank of one segment wide single ported RAMs. Other embodiments may use different types of memory.

The width of each single ported RAM is the same as the width of a bus segment. The port width is the thus the same as the width of a bus segment.

The number of RAMs in a memory bank may depend on the number of simultaneous write and read requests per cycle There may be the same number of RAMs in a bank as bus segments, For example, there may be 32 RAMs in the bank and 32 bus segments. 32 streams (the read pipes and the write pipes) may be supported with each stream associated with respective FIFOs (the elastic FIFOs of the write pipe and the FIFOs of the read pipe).

The number of RAMs may depend on the bandwidth the logical multi-bank sink memory is required to sustain. If there are fewer simultaneous write and read requests, there may be fewer RAMs in the bank. By way of example only, the number of RAMs may be 16.

The bus is segmented and each segment is written/read from the memory bank independently.

The logical sink memory is comprised of physical segment wide RAMs and the logical sink memory address is striped across the bank to ensure that all RAMs are equally loaded. For example memory cell 0 is RAM0, 1 is RAM1 and so on.

If none of the requests collide i.e. none target the same RAM cell in the same sink memory bank, all requests may proceed. If some of the requests collide the sink memory multiplexer 860 acts as an arbiter. The sink memory multiplexer 860 may for any two or more collided write requests cause the one with the most entries in the elastic FIFO to win. If the requests have the same number of entries, absolute priority based on segment buffer index may be applied. This may not result in any imbalance since the loosing segment will soon have more entries in its elastic FIFO and will win on the following rounds.

For any two collided read and write requests the arbiter may use a programmable threshold mechanism to choose the winner.

To ensure that the read response pipe always sees response data from the same buffer in order, the arbiter of the sink memory multiplexer 860 arbitrates between colliding read requests as follows. Read requests may collide if a read pipe is operating in furcated mode in which case only the segments belonging to different furcated interfaces may collide. The arbiter may choose the furcated interface with most entries in at least one of its elastic read request FIFOs and allow all segments belonging to this interface to proceed. The arbiter, in some embodiments, does not allow a subset of read requests from the same interface to proceed i.e. either all or none of the requests proceed.

Thus the cSI may manage host interfaces that furcate without having to replicate DMA engines.

The cSI can be extended into the fabric. There may be two methods for doing this. In some embodiments only one of the methods may be used. In other embodiments, both methods can be employed at the same time. The methods are exposing fabric interfaces to fabric ports and tunnelling cSI capsules via the NoC. The NoC/fabric bridge may support both methods simultaneously. For simultaneous support of both methods. the cSI interface is furcated and the resulting sub-interfaces are respectively associated with NoC and with fabric pins or connections.

From a system perspective, cSI may be expandable and adaptable for specific system needs. For that purpose, the cSI fit into one hub or be provided by a network of interconnected hubs. A hub, by itself is a n by m streaming fabric which connects n sources to m sinks. The hubs may be parametrizable and compile-time configurable.

The ease with which a custom cSI can be built using hubs and the straightforward mechanism for hub assembly support cSI composability.

The multi-hub fork-join approach may allow a portion of cSI to exist in soft logic. This means that many varied instantiations with different topologies can be created and (using dynamic reconfiguration) added to/modified at run time so as to provide connectivity for different kernels (or plugins).

The cDM (composable data mover) 824 provides the bulk data mover element of the cDMA system. The cDM is fed commands. The cDM works under the direction of the various DMA adapters to move data to and from the cSI 822 to the required endpoints. The cDM 824 is used by the DMA adapters 832. In some embodiments the cDM is exposed to the programmable logic of the NIC so other DMA adapters can be used. This may be dependent on customer or user requirements.

The cDM aims to decouple the API for DMA adaptors from the data movement process. The cDM sits between cSI and the DMA adapters. It is one of the possible clients of cSI and may be the highest bandwidth component in any DMA system. Owing to the flexibility of cSI, cDM can perform the data movement part of transactions involving one or more of PCIE host(s), CPUs, DDR, NIC and fabric clients either directly or through the NoC. This may be under the control of DMA adaptors or fabric client DMA adapters.

There may be three "data plane" data mover operations which are handled by cDM. They are invoked by requests and, when completed, generate responses (which may be suppressed in some cases).

An M2ST (memory to streaming) operation moves a contiguous block of data from target memory to a cDM streaming interface to be consumed by an adapter via a streaming interface. In this example the source is accessed using memory like transactions whereas the destination receives a data stream.

An ST2M (streaming to memory) operation moves a block of data from an adapter via a streaming interface to a location in the target memory.

An M2M (memory to memory) operation moves a contiguous block of data from one target memory location to another target memory location. The memory locations can be in the same or different physical targets.

ST2M, M2ST, and M2M may be bulk operations.

There may be two control plane data mover operations. A message load is like an M2ST operation and a message store is like an ST2M operation. These operations (interfaces and API) may be for moving control plane traffic such as descriptors and events, rather than data. This may be for short inline messages.

An adapter is a cDM client. A cDM client implements the cDM API, which consists of ST2M, M2ST, M2M, message load, and message store requests/responses. A client is not required to support all the API requests/responses. For example, some clients only perform bulk data writes (ST2M) while others only perform bulk reads (M2ST).

Figure 11:
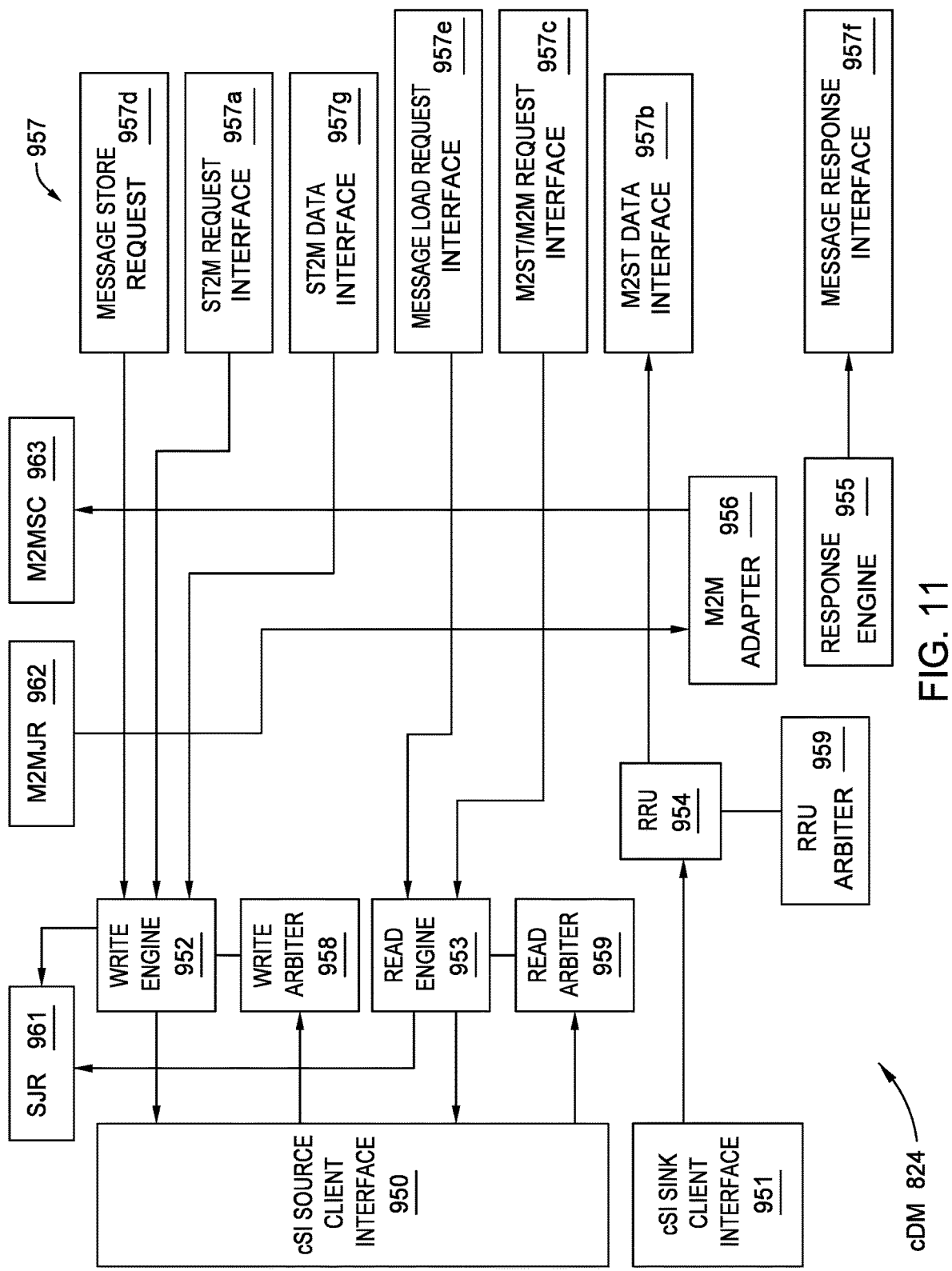
FIG. 11 shows the composable data mover cDM in more detail.

Reference is made to FIG. 11 which schematically shows the cDM 824.

The cDM 824 has various interfaces. The interfaces may operate at any suitable rate. In some embodiments, the interfaces may operate at a relatively high rate. For example, in some embodiments, the interfaces may operate at 1 GHz. Different rates may be supported by different embodiments.

A cSI source client interface 950 is provided to pass capsules from the cDM to the cSI and is flow controlled by credits passing from the cSI to the cDM.

A cSI sink client interface 951 is provided to receive capsules from the cSI and is flow controlled by credits passing to the cSI from the cDM.

The DMA adaptor interfaces 957*a* to *g* provide a respective interface between the DMA adaptor and the cDM. cDM provides a dedicated interface for each operation type by each enabled adapter. This may make it unnecessary to support multiplexing/demultiplexing and local credit schemes over the interfaces.

The DMA adaptor interfaces may comprise one or more of the following:

An adapter ST2M request interface 957*a*. This provides one or more request interfaces to support a corresponding number of write capable adapters. Each transaction may pass one ST2M request from the adapter to the cDM. The flow may be controlled by a ready/valid handshake. The requests are provided to a write engine 952.

An adapter M2ST data interface 957*b*. This provides one or more data interfaces to support a corresponding number of read capable adapters. A bus may be used. By way of example, the bus may be an AXI ST bus or any other suitable bus. The flow may be controlled by a ready/valid handshake. The data is provided by a response reassemble unit RRU 954.

An adapter M2ST/M2M request interface 957*c*. This provides one or more request interfaces to support a corresponding number of read capable adapters. Each transaction may pass one M2ST or M2M request from the adapter to the cDM. The flow may be controlled by a ready/valid handshake. The requests are provided to a read engine 953.

An adapter message store request interface 957*d*. This provides one or more request interfaces to support a corresponding number of adapters. The first transaction of a message store request passes the control portion of the request and c bits of the message data from the adapter to the cDM. Additional transactions from the adapter to the cDM, if any, pass the reminder of the message data c bits at a time (or less on the last beat). The value of c may be 128 bits or any other suitable value. The flow may be controlled by a ready/valid handshake. The requests are provided to the write engine 952.

An adapter message load request interface 957*e*. This provides one or more request interfaces to support a corresponding number of read capable adapters. Each transaction passes one message load request from the adapter to the cDM The flow may be controlled by a ready/valid handshake. The requests are provided to the read engine 953.

An adapter message response interface 957*f*. Any operation may generate a response which supplies the operation's completion status information. A message load operation generates a response which carries both the completion status and the message data. The first transaction of a response passes the completion status and the first c bits of message data from the cDM to the adapter. Additional transactions from the cDM to the adapter, if any, pass the reminder of the message data c bits at the time (or less on the last beat). The flow may be controlled by a ready/valid handshake. The responses are provided by a response engine 955. The response engine 955 receives inputs from the RRU, the read engine and the write engine. (Not shown in FIG. 11)

An adapter ST2M data interface 957*g*. This provides one or more data interfaces to support a corresponding number of write capable adapters. Any streaming bus may be used. By way of example, the bus may be an AXI ST bus. The flow may be controlled by a ready/valid handshake. The requests are provided to the write engine 952.

It should be appreciated that the adapter interfaces which are supported will depend on which one or more DMA adapters are supported by the NIC. One or more other adapter interfaces may alternatively or additionally be supported.

The cDM may also support one or more of the following interfaces.

A scheduler job response interface (SJR) 961. This interface broadcasts job responses to all cDMA initiator schedulers. The flow may be controlled by a ready/valid handshake. This interface receives job responses from the read engine 953 and the write engine 952.

M2M job request interface (M2MJR) 962. This passes job requests from an initiator scheduler to the cDM internal M2M adapter 956. The flow may be controlled by a ready/valid handshake.

M2M source credit interfaces (M2MSC) 963. This passes source credits from the cDM internal M2M adapter block 956 to the initiator scheduler. The flow may be controlled by a ready/valid handshake.

cDM may service one or more adapters. An adapter may be a hardened adaptor. The hardened adapter may be provided in the part of the NIC associated with the cDMA. The cDM provides a dedicated interface for each operation type supported by a given enabled adaptor. Each enabled adapter may own a complete set of cDM interfaces needed to perform the adapter supported cDM operations.

There may be one or more hardened and enabled adapters. Alternatively, or additionally an adaptor may be a so-called soft adapter and provided by, for example, the programmable logic or programmable circuitry. The cDM has an interface to expose the cDM adapter interfaces to the fabric to be used by one or more soft adapters.

The cDM may in some embodiments support one or more hardened adapters and/or one or more soft adapters. Any one or more or all the adapters may be active at the same time. The adaptors may comprise one or more hardened adaptors and/or one or more adaptors provided in programmable logic.

In some embodiments, regardless of the nature of an adapter and whether it is hardened or instantiated in the fabric, the adapters may use the same protocol to communicate with cDM. This is referred to as the adapter API. The adapter API uses a request-response model.

The write engine 952 is provided with a writer arbiter 958.

cSI VCs are virtual pipes featuring independent buffering resources allowing initiators, like the cDM, to perform target memory reads and writes on behalf of its clients in mutually nonblocking fashion. The memory of the response reassembly unit RRU 954 is for the data to be returned by all cDM inflight read requests. This memory is shared by all cDM clients. The RRU reorders and packs the read data and queues the data ready to be returned to the requesters into dynamic virtual FIFOs referred to as read channels. The clients utilizing read capable VCs may also be assigned an equal number of RRU read channels.

The M2M adapter 956 is responsible for the write-half of the M2M operations originated by the DMA adapters. The M2M adapter owns up to a given number of write-only VCs. The given number may be 4 or any other suitable number.

DMA adapter cDM requests may include a virtual channel identity VC ID field which the cDM translates to a cSI VC ID using per adapter or message load/store VC translation tables. In case of a read capable VC the translation table also provides the read channel ID. In other words, the cDM clients are not required to be aware of global cSI VC IDs and read channel IDs and can use a local VC ID value instead.

A request may be for a ST2M block move. A DMA adapter requests the cDM to move a block of data to a contiguous memory location accessible via a cSI interface. The adapter delivers the data block to the cDM via a streaming bus interface. The cDM expects the adapter to supply the streaming bus data blocks in the same order as the requests.

The DMA adapter may truncate a block (i.e. supply fewer bytes than specified in the request) due to an adapter error condition. To allow for this, the streaming bus may incorporate a Truncate Flag (in addition to the EOP flag). The data block may be aligned to the bus transaction boundary plus specified offset bytes. If desired, the cDM responds to the adapter upon completion of the request. Request completion, in this case, means that all the request streaming data is passed to the cSI. While executing the request, the cDM produces one or more memory write capsules belonging to the posted request PR flow type. The cDM is configured with interface's rules. The cDM knows which interface it is accessing and thus can apply different rules. One variable may be the maximum write request setting. The capsule headers are populated using one or more of the following arguments:

A client identity ID identifying a cDM client that is the DMA adaptor;

VI identity used with the client ID to lookup the cSI VC to be used by the request;

Address Information.

Length information indicating the number of bytes of data to write; Information indicating if a response is requested. If set, this instructs the cDM to generate a response once the block has been moved to the cSI interface.

The request may be a M2ST block move. An adapter requests the cDM to move a block of data from a contiguous memory location accessible via a cSI interface. The adapter collects the data block from the cDM via a streaming interface. Each M2ST request choses a read channel from a set of channels owned by the adapter that originated the request. The cDM places the same channel data blocks on the streaming interface in the same order as they were requested. The different channel requests even from the same adapter return data out of order.

The cDM may truncate the data block (i.e. supply fewer bytes than specified in the request) due to an error condition reported by the cSI (for example a PCIe read error). For example, if a read error happens from the PCIe core, the bridge receives a capsule with an error flag. It in turn generates a capsule with an error flag. The cDM sees the capsule with an error, knows which request it belongs to, truncates the data, and handles all the rest (for example ignoring additional response capsules for this request).

The data block may be aligned to a transaction boundary plus the specified offset byte. If desired, the cDM responds to the adapter upon completion of the request. Request completion, in this case, means that all the requested streaming data is delivered to adapter. While executing the request, the cDM produces one or more memory read capsules. The cDM is configured with interface's rules. It knows which interface it is accessing and thus can apply different rules. One variable here may be the maximum read request setting. The cDM collects the memory read completion capsules (belonging to the associated flow type) and uses them to assemble the requested data block. The request capsule headers are populated using one or more of the request arguments described below:

VI identity used with the client ID to lookup the cSI VC and the RRU Read channel ID to be used by the request Relaxed read information. If set, this instructs the cDM and cSI, to allow the read request capsules generated during this cDM request to bypass any in-flight write (including those with the same requester) produced by the cDM.

A request may be a M2M block move. This may be similar to the previously described request. A DMA adapter requests the cDM to move a block of data from one contiguous memory location accessible via cSI interface to another contiguous memory location also accessible via cSI interface. This request does not expose the adapter to the content of the data block. The cDM may respond to the adaptor on completion of the request. The block may be truncated, as previously described. In this example the data loops from read to write are inside the cDM. This request may use a source virtual channel ID and a destination channel ID. The source VC ID and the client ID are used to look up the cSI VC and the RRU read channel ID. The destination VC ID with the M2M adapter's client ID is used to look up the cSI VC for the write half of the request.

The request may be a message load. A DMA adapter requests the cDM to move a block of data from a contiguous memory location accessible via the cSI interface. Unlike M2ST, this request may return the requested data via the message response interface rather than placing it on the streaming interface. The request may have a VC ID which is used to lookup the cSI VC and the RRU read channel ID to be used by the request. The lookup table in this case is the cDM message load/store VC lookup table used by message load and message store requests from all cDM clients.

The request may be a message store. A cDM adapter requests the cDM to move a block of data (in this case a message) to a contiguous memory location accessible via the cSI or to send an interrupt request capsule to one of the PCIe targets. Unlike ST2M, this request consumes the data from cDM request interface rather than collecting it from a separate streaming interface. A message store operation is intended to be used to deliver notifications and interrupts signifying the completion of certain operations. Because notifications can be data-position dependent (i.e. follow the delivery of related data), the message store operation has ordering controls.

Message stores may be frequent and small. It may be desirable to combine stores that are adjacent in memory into a single transaction. To facilitate this without extra logic in adapters, the cDM implements a write combining mechanism that can be applied to any message store request. A VC ID is used to look up the cSI VC used by the request.

Responses may be generated for message load requests and on demand for other request types. The message load response makes use of the response payload component to supply the message block. Responses may be returned in the same order as the corresponding requests were executed, which is not necessarily the same as the issue order.

An ST2M response is issued when all write capsules corresponding to this request have been passed to the cSI.

An M2M response is issued when all capsules corresponding to this request have been received from the cSI and all write capsules corresponding to this request have been issued to cSI.

An M2ST response is issued when all capsules corresponding to this request have been received from the cSI and the requested block has been streamed to the adapter.

A message store response is issued when all write capsules corresponding to this request have been passed to the cSI.

A message load response control component is issued when all capsules corresponding to this request have been received from the cSI. The response control component is passed to the adapter at the same time as the first transaction of the response payload component.

The ST2M, M2M write half, and message store traffic compete for the cDM write engine (WE) 952 bandwidth. The cDM implements an internal arbiter—the write arbiter (WA) 958 to load balance between these request types. The WA is responsible for ensuring that message store traffic and data write traffic share WE bandwidth appropriately and that the WE does not head of line block or deadlock.

To ensure that the WE 952 transfers message store data at full speed (independent of the adapter speed), the WA 958 monitors the state of the message store FIFOs and does not select a FIFO if the FIFO does not appear to hold at least one complete message.

To ensure that the WE transfers ST2M data at full speed (independent of the adapter speed), the WA 958 monitors the state of the ST2M data FIFOs and does not schedule a thread if the FIFO does not appear to hold enough data to finish the request or to form at least one capsule.

While arbitrating between the threads, the WA 958 aims to achieve the following:

The ST2M request sources share WE bandwidth equally.

The message store request sources share WE bandwidth equally,

The message store request vs ST2M request arbitration is based on programmable priority.

The write engine WE 952 provides ST2M processing.

The cDM sees a given number of FIFO pairs where one FIFO in a pair carries a ST2M request and the other FIFO carries ST2M data. Each pair is owned by an adapter instance. The adapter decides (under cDMA scheduler control) which one of its internal sources (queues) pushes the next ST2M request/data and guarantees that the requests and the data are seen by the cDM in the same order.

The WE processes ST2M requests from the given number of FIFO pairs in parallel using one thread for each. The WE consults the arbiter at each capsule boundary.

Following completion of an ST2M request the WE engine emits a response word (if requested by the request) to the response engine.

Following completion of an ST2M request marked with an end of job flag, the WE uses the values of per thread job cost and resource credit accumulators to generate a job response message to the scheduler.

The write engine WE 952 provides message store processing.

The cDM sees a given number of FIFOs carrying message store requests. The WE processes message store requests from the given number of FIFOs sequentially. Once a thread accepts a request it processes it to the end without suspending. The engine consults the arbiter once it completes the request.

Following completion of a message store request the WE emits a response word (if requested by the request) to the response engine.

The write engine WE 952 provides message store—ST2M data synchronization. Message store operations are commonly used to write out events that notify a cDMA application about ST2M data delivery. Such events should not overtake the corresponding data. The cDM and the cSI incorporate logic to synchronize the arrival of selected ST2M request data and the corresponding message store request data.

A cDMA application can enforce an arbitrary order between any set of DMA requests by employing barriers. The cDM and cSI may implement dedicated logic for this synchronization scenario.

Adapters can ask for message store—ST2M request synchronization using a message store request argument. The cDM does not decouple synchronized and not synchronized message store requests from the same adapter and instead buffers message store requests in the per adapter message store request FIFOs.

To ensure that a synchronized message store request retains its position relative to ST2M data all the way to the target, the message store data utilizes the same cSI VC as the ST2M data. The ST2M data and the message data will share the same buffers in the sink memory.

The WE may provide message store write combining. This is performed within the WE.

The M2ST, M2M read half, and message load traffic compete for the cDM read engine (RE) 953 bandwidth. The cDM implements an internal arbiter, the read arbiter (RA) 959 to load balance between these request types.

The RA is responsible for ensuring that message load requests and data, and data read requests share RE bandwidth appropriately and that the RE does not head of line block.

While arbitrating between the threads the RA aims to achieve the following:

The M2ST/M2M-read-half request sources share the RE bandwidth equally.

The message load request sources share the RE bandwidth equally.

The message load request vs M2ST/M2M-read-half request arbitration is based on programmable priority.

The read engine 953 may perform M2ST processing. The cDM sees FIFOs carrying M2ST and M2M requests. The adapter decides which one of its internal sources (queues) pushes the next M2ST/M2M request.

The RE processes M2ST/M2M requests from the FIFOs in parallel using one thread for each. The read engine consults the arbiter at each capsule boundary.

Following completion of an M2ST/M2M request marked with end of job flag the RA uses the values of per thread job cost and resource credit accumulators to generate job response message to the scheduler. The M2ST and M2M may be treated the same for the purpose of job cost and resource credit calculation.

At the beginning of each M2M request, the RA generates the M2M state word and passes it to cDM internal M2M adapter. This word acts as a context that allows the adapter to process the M2M read data, which it receives from RRU, and to complete the write halves of M2M requests.

The RE may provide message load processing.

The cDM sees a number of FIFOs carrying message load requests. The RE processes message load requests from the FIFOs sequentially. Once a thread accepts a request, it processes it to the end without suspending. The read engine consults the arbiter once it completes the request.

For each non-posted request NPR capsule output to the cSI source interface, the RA acquires a free NPR tag value from a free tag pool maintained by RE, places the tag into the capsule pseudo header, and emits the read state word containing the tag and other context to the RRU. This word carries the context that allows the RRU to process the capsules carrying the data requested by the NPR. The tags are returned to the free tag pool by the RRU after it collects all requested data for the given NPR The RE may provide RRU memory space tracking. The RRU memory is a relatively limited resource. When all of the RRU memory is reserved for inflight read requests, the RE stalls the current thread. The RRU memory is a collection of buffers. The buffers hold completion capsule payloads. Different payloads may not share the same buffer. The RE determines (based on the read request address and the target completion payload length setting) how many completion capsules and of what size the request will generate and reduces the RRU memory free buffer count by the appropriate amount. The RRU may report back to the RE each time a buffer is freed.

The RRU 954 processes read response data belonging to M2ST, M2M, and message load requests. The RRU receives completion capsules from the cSI sink interfaces. Each capsule carries the NPR tag of the corresponding non-posted request.

The RRU maintains the state of outstanding NPRs indexed by the tag value. The RRU also maintains the NPR issue order. Every NPR issued by the RE is associated with a read channel, identified by the cDM request which produces the NPR. The RRU maintains NPR order separately for each read channel. Capsule payloads are stored in RRU memory. The RRU keeps track of the amount of data received by each read channel and communicates it to RRU scheduler in form of source credits. The RRU scheduler also receives destination credit information from read data recipients informing it how much read response data each recipient can accept.

There may be one or more of the following read data recipients:

The cDM response engine which receives message load data;

The M2M cDM internal adapter which receives M2M read data; and

One or more external adapters.

Each recipient owns one or more read channels.

The scheduler schedules blocks of data to be transferred from a qualified read channel to the corresponding recipients. Only in order data (without holes) is transferred. If while transferring the read channel data to the recipient, the RRU discovers an incomplete NPR response, the block terminates the transfer (without transferring any of the NPR response data) and informs the scheduler (using source credits) that the read channel has no data. This prevents the scheduler from continuing to schedule the same channel again, thereby wasting RRU bandwidth. When the hole is filled RRU informs the scheduler about the presence of data in the channel.

The data arrives to the recipients via rate match FIFOs. In some embodiments, there may be one FIFO per recipient. The FIFOs allow the RRU to egress data at a maximum speed (for example 800 Gbps or any other suitable speed) and the recipient to receive the data at its own speed. The FIFOs may not be needed by the response engine and M2M adapters as these are cDM internal blocks which may accept the data at the maximum speed. The one or more external adapters may require the rate match FIFOs. The FIFO sizes may be defined by the maximum number of outstanding jobs multiplied by the job length multiplied by the cDM—adapter speed ratio.

The RRU may pack the data belonging to the same cDM requests before pushing it to the rate match FIFO, such that the data starts at the request specified offset in the first word and fills all but the last bus words completely.

The RRU maintains the context of the outstanding cDM requests. The cDM request information is provided to RRU as a part of the read state word from the RE. This context allows the RRU to generate the response word to the response engine for each completed cDM request that requires one.

The M2M adapter 956 performs the write halves of M2M requests. The M2M adapter receives M2M read state words from the RE which carry M2M request contexts. The M2M adapter uses this context to process the in order M2M request read data that it accepts from RRU. The M2M adapter utilizes cSI write-only VCs and RRU read channels. Internally the M2M adapter implements circular buffers. There may be one to one correspondence between the M2M cSI VCs, RRU read channels, and internal circular buffers. The buffers accept the data from RRU read channels (channel per buffer) and advertises the destination credits to RRU scheduler. The same buffers act as data sources for the cDMA initiator scheduler 836 (see FIG. 6) which associates one cSI VC with each buffer. The cDMA initiator scheduler issues job requests to the M2M adapter, the adapter executes the job requests by issuing one or more ST2M requests/data to the cDM WE, the scheduler receives job responses for M2M and the other adapters' job requests from WE. In other words, the internal M2M adapter may function in the same way as the external adapters.

The response engine 955 generates responses to the adapters. The response engine receives response content from the write engine, the M2M adapter and the RRU, the connections to which have been omitted for clarity.

ST2M and message store response content is supplied by the write engine.

M2ST response content is supplied by RRU 954.

M2M response content is supplied by the M2M adapter 956.

The message load response and message load response data are supplied by the RRU 954.

A plurality of different DMA adaptors 832 may be provided as described previously.

DMA adapters provide the API element of the DMA system, allowing the bulk data mover to be expressed in the required functionality of the DMA interfaces needed in a given system. Examples of some DMA interfaces are:

QDMA—provided by the current applicant;

EF100—used with network stacks and applications and again provided by the current applicant;

Virtio—for use by hyper scale customers.

Other DMA adapters to suit particular customers are possible. These may be composed in soft logic. In this latter case the cDM, cSched (composable scheduler) and cDC (composable descriptor cache) interfaces may need to be made available at the programmable logic boundary.

One or more DMA schemas may support streaming and/or one or more maynot.

One or more DMA schemas support multiple queues and/or one or more may not i.e. single-queue.

DMA adapters may be connected directly to the PL or to the NoC as required.

The specific requirements of a given DMA scheme are handled by the DMA adaptors.

DMA engines may benefit from descriptor management in order to improve performance. This may be to reduce the latency of fetching descriptors from host memory which may affect throughput and transfer rate. DMA engines may benefit from descriptor prefetch. In some embodiments, there may be more than one DMA adaptor. The different DMA adaptors may implement different DMA APIs to support the varied needs of host software. To facilitate a high data throughput, the DMA system should have a relatively high chance of being able to load an appropriate descriptor from local memory, rather than having to fetch it from the host or elsewhere off chip.

The cDC (composable descriptor cache) module 834 shown in FIG. 6 manages a relatively large block of memory set aside for holding DMA descriptors (to reduce latency) on behalf of all the DMA adapters in the cDMA system. This may include those DMA adaptors implemented in soft logic. This may allow that memory to be optimally distributed and re-used. The cDC may be exposed to the fabric so that user-level adapters can take advantage of the ordered storage available. cDC thus exists to provide managed access to a shared memory resource for storing descriptors potentially for two or more DMA adapters.

Scheduling may be controlled by one or more schedulers 836. The scheduler may be required for scheduling initiator access to shared targets.

The cDC is connected to each of the DMA adapters. This may include a fabric interface so that soft DMA adapters can take advantage of cDC's resources. The main connection to the cDC may be via combined command and data request and response buses, operating at the frequency of the block. The flow may be controlled with Rdy/Vld (ready/valid) signals. The request bus and the response bus may be the same or different sizes. The response bus may in some embodiments be wider than the request bus. The interface to the cDC may be multiplexed to two or more DMA adapters and the PL via the cDC-MDML (multiplexer/demultiplexer logic) 844. The multiplexing may be based on a client identity field that is part of requests and responses.

The cDC may comprise two memory structures: the actual descriptor cache memory, and memory for tracking the state (read/pop/write pointers) of active/open lists.

The cDC may sustain one descriptor read and one descriptor write per cycle. The request/response scheme may allow two or more commands to be issued together every cycle. The cDC may perform one get list or one put list operation roughly every n clock cycles (n may for example be every 64 clock cycles or any other suitable number). Operations involving more than one descriptor may pass one descriptor per clock, and thus occupy the request/response bus for multiple cycles.

The cDC holds sequences of DMA commands until they are used by an adapter. For that, the cDC maintains descriptor lists that contain descriptors in FIFO order. From a cDC perspective, descriptors may be a constant size (for example 128 bit/16 byte or any other suitable size) chunks of data that the adapters can use freely to fill with DMA commands, addresses, etc. The content of the descriptors is opaque to the cDC. In some embodiments, the only requirement may be that the access to descriptor chunks is in-order, following a FIFO order—with added flexibility for supporting head/tail (read/write) pointer adjustments and separate reclamation.

The cDC maintains a maximum number of active lists of descriptors which is configurable at compile time and stores the associated descriptors. Each active cDC list serves one DMA adapter queue containing one or more jobs (a subsequence of consecutive DMA commands). An adapter interacts with the cache by the means of four request operations: get list, put list, write descriptor, and read descriptor.

Get list allocates a free list in the cDC, associates it with the provided queue ID, and logically reserves space for the list. This operation returns the allocated list ID <LID> and how many descriptors need to be read in.

With an existing queue/list association, get list indicates the start of a new job on the same queue to the cache.

Put list declares the end of a job of an active queue/list, frees entries that will not be used anymore, and potentially closes the entire list/queue. When a queue is ended, the list is returned to the pool of free lists for association with another queue in the future.

The write descriptor adds one or more new descriptor entries to the tail of the list specified by the queue ID and the list ID at location of the write pointer and adjusts the write accordingly.

The read descriptor retrieves one or more descriptors from the head of the list specified in the queue ID and the list ID from the read pointer location, adjusts the read pointer, and returns the retrieved descriptors in the response. Optionally, the command can also pop descriptor entries from the list, by adjusting a pop pointer.

The cDC sends a evict response messages on the response channel whenever it evicts an idle list. The message contains the evicted queue and list IDs and optionally additional eviction state.

These four operations can be merged in one cycle, and in high-throughput cases, both a read descriptor and write descriptor may occur in one cycle.

Each request and response may contain a client ID (CLIENT_ID) that uniquely identifies the adapter using the cDC and a queue ID (QID) and list ID (LID) which together specify a cached list. Both may be used in some embodiments, as the cache can decide to evict lists/queues, and re-associate the same list (LID) with a different queue that is requested by the adapter. In some embodiments, queue IDs can be reused across adapters, so the (CLIENT_ID, QID) pair is needed to uniquely identify a queue.

An example flow between a DMA adapter and cDC may be as follows:

An adapter receives a job request from the scheduler. This queue has not been used—the queue state contains no valid cDC LID.

The adapter issues a get list request with LID set to −1 and asks for the number of descriptors it estimates it needs to complete the job. For example, the DMA adaptor will ask for 32 descriptors.

If the adapter receives more job requests before it receives a response from the cache, it issues more get list requests with LID set to −1.

A response for the first get list command is received.

This supplies the LID together with how many descriptors the adapter should add to the cache. Since this is the first get list for the list (there are no descriptors present or requested) the number of descriptors "needed" will be the same as the number of descriptors "wanted".

Responses for additional get list commands to the same queue will all have the same LID as the one returned in the first get list response.

Following the first get list response, the adapter associates the LID with the requesting queue i.e. stores the LID in its queue state table.

Following each get list response, the adapter fetches the "needed" number of descriptors i.e. issues message load request(s) to cDM to fetch the descriptors from the appropriate location. The location may be any suitable location such as from the host, DRAM (dynamic random access memory), programmable logic memory or any other suitable location The adapter receives descriptors from the cDM and passes them to the cDC using the write descriptor command.

The adapter receives and executes a job request.

At this time, it is expected that the queue has a valid LID. This property is guaranteed by the adapter having properly prioritized future job requests against this job request. If no valid LID is present the adapter terminates the job without executing it (as a zero-length job).

If a valid LID is present, the adapter executes the job and issues a series of descriptor read requests.

The descriptor read operation is pipelined, meaning that the adapter is expected to have multiple descriptors reads in flight during job execution.

Depending on the nature of the adapter, it may be requesting one or more descriptors in each request. Read requests also instruct pop pointers to increment to match the number of descriptors already consumed. This is done in a timely way to free cache memory.

The adapter may monitor for response-incomplete and insufficient descriptor errors and react accordingly.

The adapter completes the job.

When the adapter completes a job it issues a put list request.

A high-performance pipelined adapter may overshoot the end of job by N descriptors (N is pipe depth) i.e. it will still have N descriptor read requests in flight when it reaches the job end condition. The put list request tells the cache how many descriptors it can forget about and how many descriptors will have to be re-fetched.

DMA adapters may overshoot their get list allocations as the job size in numbers of descriptors is often not known in advance, so the adapters may ask for a default that captures most typical conditions. Often, fewer descriptors are needed.

If an adapter knows the precise number of descriptors needed ahead of time, it can overestimate that (at the cost of using more cache space and thus evicting other queues) in order to have more descriptor fetches in flight.

The put list operation can be combined with get list and/or read descriptors for the next job if it happens to be for the same list.

After this sequence of operations runs its course to completion, the two per-list reference counters maintained by the cDC (one counting outstanding gets for the list and the other outstanding descriptors for the list) will both become zero. The list/queue will be then eligible for eviction.

During the processing, the adapter may receive an evict response message with the used <QID> and <LID> and additional eviction descriptor location information. This occurrence causes the adapter to re-stablish the list, and re-fetch missing entries.

DMA adapters fetch DMA descriptors and write them into a cDC list, and later read them again to perform the requested DMA operations. The cDC may provide storage for the DMA adapters so they can have enough requests in flight to cover memory access latencies. The descriptor memory of the cDC is finite (also specified at compile time), and when exhausted, idle lists and their stored descriptors are evicted. Eviction only occurs for lists that are not currently processing a job. Lists that were evicted are subsequently available to be associated with other DMA queues. Freed descriptor memory entries are available to hold new entries. Evictions are propagated to the requesting DMA adapter through eviction messages and adapters will have to allocate a new list, and re-fetch and write evicted descriptors. The dynamic association between queues and lists keeps the tracking structures of the cDC independent of the total (and potentially large) number of available queue IDs. The eviction timing may simplify DMA adapter design, as evictions can only occur during well-defined points of the queue lifetime (when there is no active job).

The cDC manages its internal descriptor and list resources without any adapter involvement.

The cache automatically assigns available lists to queues and reserves the required amount of descriptor memory space.

The cache automatically evicts queues that it believes are not in immediate use. To avoid complex race conditions in adapters, the cache maintains that the following condition is satisfied for a queue to be eligible for eviction:

The list associated with the queue has no pending put list operations i.e. the list's reference counter (which incremented for each get list and decremented for each put list) is zero. This means that the list is in the Idle state.

Because writes can only be pending after a get list that has not yet been closed by put list, the list associated with the queue has no pending descriptors. In other words, the list's reference counter which is incremented for each get list response by the specified number of descriptors and decremented for each write descriptor by the specified number of descriptors is zero.

Overall, this condition means that a queue will not be evicted while one (or more) jobs are being executed. Only after in-flight jobs have completed (all encountered get list operations were closed by receiving the same number of put list operations) will the queue be evicted. That can, however, be before the queue itself has been completely executed and closed.

When a queue is evicted the following may take place:

The list associated with the queue is released to the free list pool and becomes available for use by new get list operations.

The descriptor memory locations holding the queue descriptors referenced by the list are released to the free descriptor memory pool and become available for use by new get list operations.

The cDC sends an evict response message to the original user of the queue.

A layer of multiplexing and de-multiplexing logic (cDC-MDML) 844 provides the necessary cDC to many-adapter connectivity. The MDML is outside of the cDC block, meaning that the cDC-adapter interfaces and behaviour are unchanged regardless of the number and nature of the adapters. The cDC to adapter API uses a request-response model.

The cDC is comprised of one logical thread which executes all requests in the order they are supplied.

Schedulers are required to manage the traffic in any situation where multiple streams access a shared buffer resource or the buffer resource is subject to backpressure. Schedulers may be composed of various scheduling entity types and may take a significant time to complete a scheduling operation—sometimes tens of clock cycles. To accommodate this, data movement may be scheduled in job units where a job might be 2 kB. This is by way of example and other job sizes may be used in other embodiments. Job response messages may be moderated (i.e. aggregated) before being passed back to schedulers to avoid overloading them.

The host access handler HAH 828 may the flow of doorbells to DMA adapters, moderating doorbell access.

The HAH may process all target accesses from host(s) both non-DMA and DMA-specific.

Figure 12:
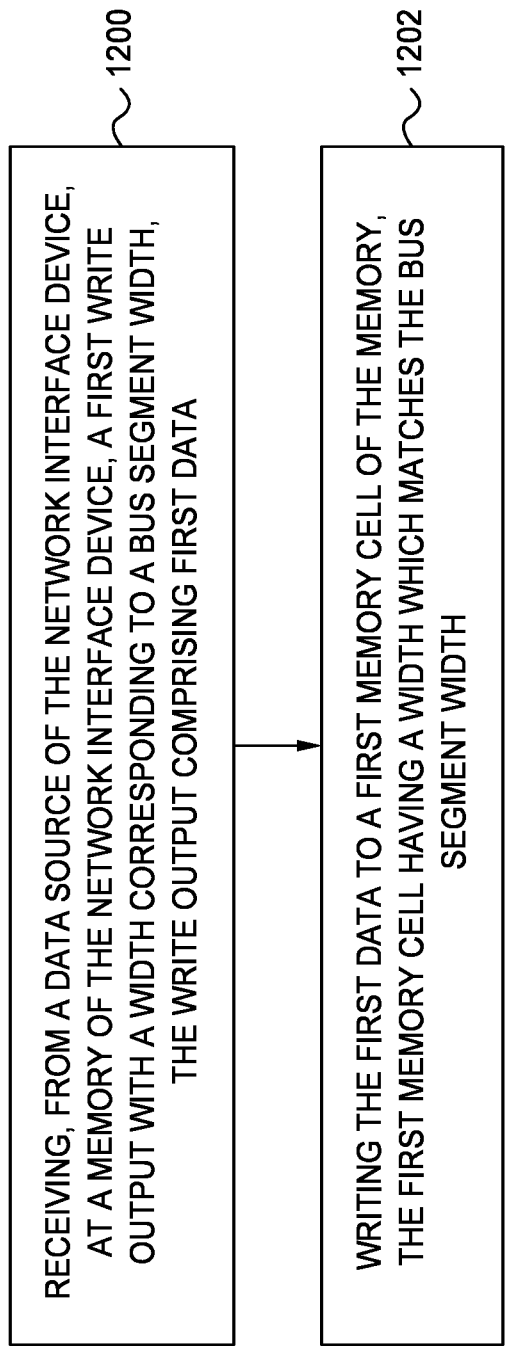
FIG. 12 shows a method of some embodiments.

Reference is made to FIG. 12 which shows a method of some embodiments.

As referenced 1200, the method comprises receiving, from a data source of the network interface device, at a memory of the network interface device, a first write output with a width corresponding to a bus segment width, the write output comprising first data.

This write output may be provided by the output of the write pipe 862 described previously in relation to FIG. 8, for example.

As referenced 1202, the method comprises writing the first data to a first memory cell of the memory, the first memory cell having a width which matches the bus segment width.

The memory may be the sink memory such as previously described. The memory may comprise physical segment wide memory cells such as RAM cells.

It should be appreciated that the cSI 822 is one example of an interconnect and other embodiments may use any other suitable interconnect arrangement which has a memory with memory cells having a width that matches the width of the bus segment.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

The invention claimed is:

1. A network interface device, the network interface device comprising:
   a data source;
   a data sink; and
   an interconnect configured to receive data from the data source and to output data to the data sink, the interconnect comprising:
      a memory having memory cells, each memory cell having a width which matches a bus segment width, the memory being configured to receive a first write output with a width corresponding to the bus segment width, the first write output comprising first data to be written to a first memory cell of the memory, the first data being from the data source; and
      an interface having a width equal to the bus segment width, the interface being configured to receive data from a plurality of different data sources at the same time.

2. The network interface device as claimed in claim 1, comprising one or more segmented buses connecting the data source and the data sink to the interconnect, the segmented buses comprising bus segments having the bus segment width.

3. The network interface device as claimed in claim 1, wherein the memory is configured to output the first data in response to a read request from the data sink, the output having the bus segment width.

4. The network interface device as claimed in claim 1, wherein the interconnect comprises a memory multiplexer configured to receive a plurality of requests, the plurality of requests comprise a plurality of read requests from a plurality of data sinks and a plurality of write requests from a plurality of data sinks, the memory multiplexer being configured to determine which one or more of the requests is to proceed and which one or more requests are to be back pressured.

5. The network interface device as claimed in claim 1, wherein the interconnect comprises a configurable interface, the configurable interface being configurable to provide one or more interfaces with each individual interface having a size equal to an integer multiple of the bus segment width, the integer multiple being one or more.

6. The network interface device as claimed in claim 1, comprising a write pipe configured to receive a first write request for the first data from the data source, to associate an address of the first memory cell with the first data of the first write request and to provide the first write output.

7. The network interface device as claimed in claim 1, comprising a read request pipe configured to receive a read request from the data sink and to associate an address of a memory cell of the memory from which data is to be read with the read request.

8. The network interface device as claimed in claim 1, wherein the data source is configured to output capsules and the data sink is configured to receive capsules, the capsules comprising data and routing information.

9. The network interface as claimed in claim 1, wherein each memory cell comprises a random access memory having a port width which is the width of a bus segment.

10. The network interface device as claimed in claim 4, wherein the memory multiplexer is configured to determine that two requests are for the same memory cell of the memory and to determine which one of the two requests is to be proceed based on which request is part of a larger series of requests.

11. The network interface device as claimed in claim 5, wherein different ones of the individual interfaces of the configurable interface are configured to receive data for different data sinks.

12. The network interface device as claimed in claim 5, wherein a total width of the configurable interface is equal to a total width of all bus segments of a bus.

13. The network interface device as claimed in claim 6, wherein the write pipe comprises a buffer for storing the first write output before the first write output is output by the write pipe.

14. A network interface device, the network interface device comprising:
   a data source;
   a data sink, wherein the data source is configured to output capsules and the data sink is configured to receive capsules, the capsules comprising data and routing information; and
   an interconnect configured to receive the capsules from the data source and to output the capsules to the data sink, the interconnect comprising:

a memory having memory cells, each memory cell having a width which matches a bus segment width, the memory being configured to receive a first write output with a width corresponding to the bus segment width, the first write output comprising first data to be written to a first memory cell of the memory, the first data being from the data source.

15. The network interface device as claimed in claim 14, comprising one or more segmented buses connecting the data source and the data sink to the interconnect, the segmented buses comprising bus segments having the bus segment width.

16. The network interface device as claimed in claim 14, wherein the memory is configured to output the first data in response to a read request from the data sink, the output having the bus segment width.

17. The network interface device as claimed in claim 14, wherein the interconnect comprises an interface, the interface having a width equal to a width of all bus segments of a bus, the interface being configured to receive data from a plurality of different data sources at the same time.

18. A network interface device, the network interface device comprising:
   a data source;
   a data sink; and
   an interconnect configured to receive data from the data source and to output data to the data sink, the interconnect comprising:
      a memory having memory cells, each memory cell comprising a random access memory having a port width which matches a bus segment width, the memory being configured to receive a first write output with a width corresponding to the bus segment width, the first write output comprising first data to be written to a first memory cell of the memory, the first data being from the data source.

19. The network interface device as claimed in claim 18, comprising one or more segmented buses connecting the data source and the data sink to the interconnect, the segmented buses comprising bus segments having the bus segment width.

20. The network interface device as claimed in claim 18, wherein the interconnect comprises an interface, the interface having a width equal to a width of all bus segments of a bus, the interface being configured to receive data from a plurality of different data sources at the same time.

* * * * *